United States Patent
Kim et al.

(10) Patent No.: US 11,243,510 B2
(45) Date of Patent: Feb. 8, 2022

(54) COMPUTER AIDED GENERATIVE DESIGN WITH TOOL SIZE CONTROL TO FACILITATE 2.5-AXIS SUBTRACTIVE MANUFACTURING PROCESSES

(71) Applicant: Autodesk, Inc., San Rafael, CA (US)

(72) Inventors: Nam Ho Kim, Gainesville, FL (US); David Jon Weinberg, Gig Harbor, WA (US)

(73) Assignee: Autodesk, Inc., San Rafael, CA (US)

( * ) Notice: Subject to any disclaimer, the term of this patent is extended or adjusted under 35 U.S.C. 154(b) by 13 days.

(21) Appl. No.: 16/931,866

(22) Filed: Jul. 17, 2020

(65) Prior Publication Data

US 2021/0365007 A1   Nov. 25, 2021

Related U.S. Application Data

(63) Continuation-in-part of application No. 16/879,547, filed on May 20, 2020.

(51) Int. Cl.
*G05B 19/4155* (2006.01)
*G06F 30/10* (2020.01)

(52) U.S. Cl.
CPC ......... *G05B 19/4155* (2013.01); *G06F 30/10* (2020.01); *G05B 2219/37355* (2013.01)

(58) Field of Classification Search
CPC ...... G05B 19/4155; G05B 2219/37355; G06F 30/10
See application file for complete search history.

(56) References Cited

U.S. PATENT DOCUMENTS

| | | | |
|---|---|---|---|
| 2015/0294034 A1 | 10/2015 | Liao | |
| 2016/0246280 A1 | 8/2016 | Singh | |
| 2018/0345647 A1 | 12/2018 | Morris et al. | |
| 2018/0349531 A1* | 12/2018 | Morris | B33Y 10/00 |

(Continued)

OTHER PUBLICATIONS

Morris "A subtractive manufacturing constraint for level set topology optimization" from "Structural and Multidisciplinary Optimization (2020), Feb. 2020" (Year: 2020).*

(Continued)

*Primary Examiner* — Yuhui R Pan
(74) *Attorney, Agent, or Firm* — Fish & Richardson P.C.

(57) ABSTRACT

Methods, systems, and apparatus, including medium-encoded computer program products, for computer aided design of physical structures include: obtaining a density-based representation of a modeled object and data specifying a starting element for each of multiple different subsets of elements; processing starting elements having milling depths associated with layers below a top most layer, the processing including, for a current starting element for a current layer, identifying other starting elements that have milling depths associated with a layer above the current layer and are closer to the current starting element than an amount at least equal to a radius of a smallest available milling tool, calculating a maximum angular difference, and moving the milling depth for the element subset of the current starting element to a layer above the current layer, responsive to the maximum angular difference being greater than a threshold, to remove a non-manufacturable corner.

24 Claims, 13 Drawing Sheets

(56) References Cited

U.S. PATENT DOCUMENTS

2020/0150623 A1    5/2020    Bandara et al.
2020/0151286 A1*   5/2020    Willis .................... G06F 30/00

OTHER PUBLICATIONS

Liu et al., "Topology Optimization for Hybrid Additive-Subtractive Manufacturing", Structural and Multidisciplinary Optimization, Aug. 29, 2016, 55(40:1281-1299).
Morris et al., "A Subtractive Manufacturing Constraint for Level Set Topology Optimization", Structural and Multidisciplinary Optimization, Jul. 3, 2019, 1-16.
PCT International Search Report and Written Opinion in International Appln. No. PCT/US2021/028373, dated Aug. 10, 2021, 10 pages.
Guyder et al., "Automating the Optimization of 2 1/2 Axis Milling", Computers in Industry, Nov. 1990, 15(3):163-168.
PCT International Search Report and Written Opinion in International Appln. No. PCT/US2021/028355, dated Jul. 15, 2021, 16 pages.
Unknown author, "Topology Optimization R18.0 Feature and Usage Highlights," © 2016 ANSYS, Inc., Mar. 12, 2017, 29 pages.
Arisoy et al., "Design and Topology Optimization of Lattice Structures Using Deformable Implicit Surfaces for Additive Manufacturing," in ASME 2015 International Design Engineering Technical Conferences and Computers and Information in Engineering Conference (2015) 11 pages.
Brackett et al., "Topology Optimization for Additive Manufacturing," in Proceedings of the Solid Freeform Fabrication Symposium (2011) 15 pages.
Dapogny et al., "Geometric Constraints for Shape and Topology Optimization in Architectural Design," Computational Mechanics, Springer-Verlag, 2017, 59(6):933-965. 10.1007/s00466-017-1383-6. hal-01354004v3.
Gibou et al., "A Review of Level-set Methods and Some Recent Applications," Journal of Computational Physics (2018) 353:82-109.
Guest and Zhu, "Casting and Milling Restrictions in Topology Optimization via Projectionbased Algorithms," in ASME 2012 International Design Engineering Technical Conferences and Computers and Information in Engineering Conference (2012) 8 pages.
Ikeya and Shimoda, "Multi-objective Free-form Optimization for Shape and Thickness of Shell Structures with Composite Materials," in $11^{th}$ World Congress on Structural and Multidisciplinary Optimisation (2015) 6 pages.
Joshi et al., "CAD-integrated Topology Optimization (BGCE Honours Project)," Department of Informatics, Technical University of Munich (2016) 77 pages.
Langelaar, "Topology Optimization for Multi-axis Machining," Comput. Methods Appl. Mech. Engrg. (2019) 351:226-252.
Liu et al., "Current and Future Trends in Topology Optimization for Additive Manufacturing," Structural and Multidisciplinary Optimization (2018) 57:2457-2483.
Liu and Ma, "A Survey of Manufacturing Oriented Topology Optimization Methods," Advances in Engineering Software (2016) 100:161-175.
Lu et al., "Build-to-Last: Strength to Weight 3D Printed Objects," ACM Trans. Graph. (2014) 33(4):97:1-97:10.
Nakayama and Shimoda, "Shape-topology Optimization for Designing Shell Structures," in VII European Congress on Computational Methods in Applied Sciences and Engineering (2016) 10 pages.
Sigmund and Maute, "Topology Optimization Approaches—a Comparative Review," Struct. Multidisc. Optim. (2013) 48:1031-1055.
van Dijk et al., "Level-set Methods for Structural Topology Optimization: a Review," Struct. Multidisc. Optim. (2013) 48:437-472.
Vatanabe et al., "Topology Optimization with Manufacturing Constraints: a Unified Projection-based Approach," Advances in Engineering Software (2016) 100:97-112.
Xia et al., "A Level Set Based Method for the Optimization of Cast Part," Struct. Multidisc. Optim. (2010)41:735-747.

* cited by examiner

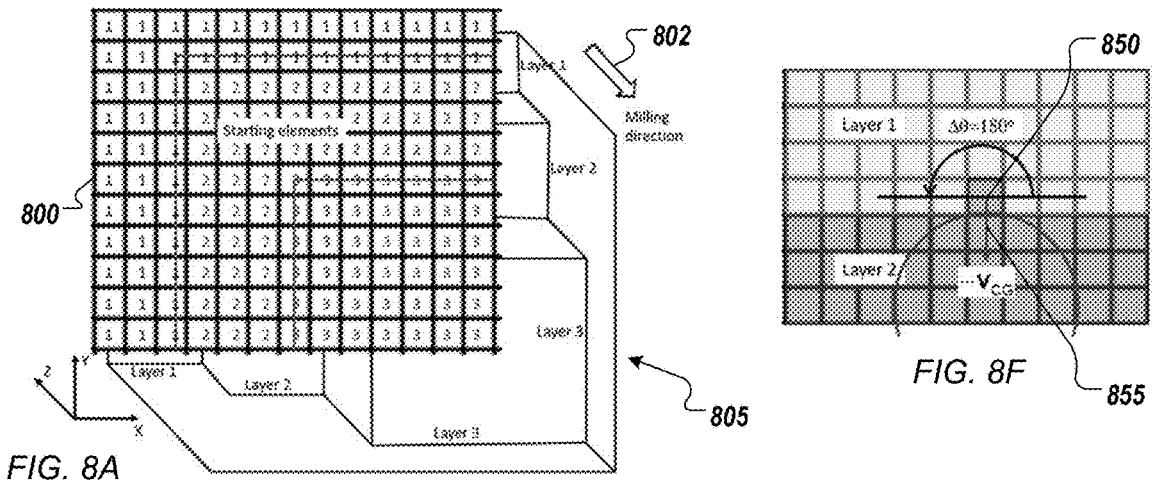
FIG. 8A
FIG. 8F
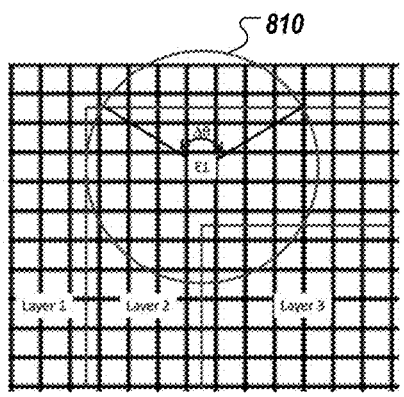
FIG. 8B
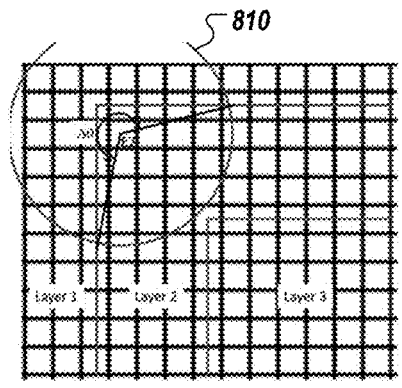
FIG. 8C
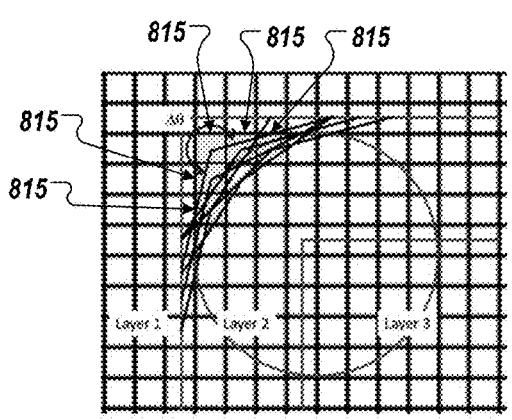
FIG. 8D
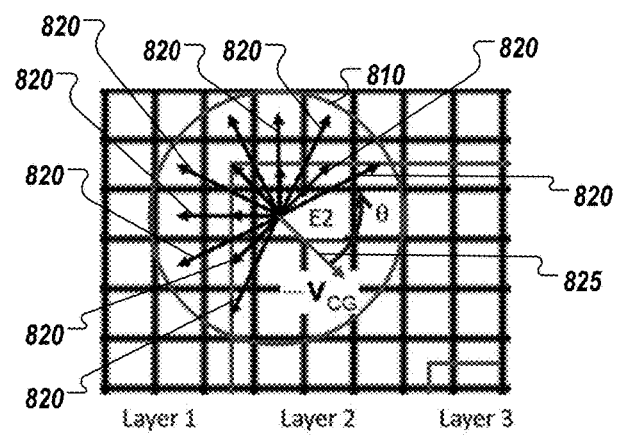
FIG. 8E

COMPUTER AIDED GENERATIVE DESIGN WITH TOOL SIZE CONTROL TO FACILITATE 2.5-AXIS SUBTRACTIVE MANUFACTURING PROCESSES

CROSS-REFERENCE TO RELATED APPLICATIONS

This application is a continuation-in-part application of, and claims the benefit of priority of, U.S. patent application Ser. No. 16/879,547, entitled COMPUTER AIDED GENERATIVE DESIGN WITH LAYER BOUNDARY DETERMINATION TO FACILITATE 2.5-AXIS SUBTRACTIVE MANUFACTURING PROCESSES, to inventors David Jon Weinberg and Nam Ho Kim, which application was filed on May 20, 2020, and which application is hereby incorporated by reference.

BACKGROUND

This specification relates to computer aided design of physical structures, which can be manufactured using additive manufacturing, subtractive manufacturing and/or other manufacturing systems and techniques.

Computer Aided Design (CAD) software has been developed and used to generate three-dimensional (3D) representations of objects, and Computer Aided Manufacturing (CAM) software has been developed and used to evaluate, plan and control the manufacture of the physical structures of those objects, e.g., using Computer Numerical Control (CNC) manufacturing techniques. Typically, CAD software stores the 3D representations of the geometry of the objects being modeled using a boundary representation (B-Rep) format. A B-Rep model is a set of connected surface elements specifying boundaries between a solid portion and a non-solid portion of the modelled 3D object. In a B-Rep model (often referred to as a B-Rep), geometry is stored in the computer using smooth and precise mathematical surfaces, in contrast to the discrete and approximate surfaces of a mesh model, which can be difficult to work with in a CAD program.

CAD programs have been used in conjunction with subtractive manufacturing systems and techniques. Subtractive manufacturing refers to any manufacturing process where 3D objects are created from stock material (generally a "blank" or "workpiece" that is larger than the 3D object) by cutting away portions of the stock material. Such manufacturing processes typically involve the use of multiple CNC machine cutting tools in a series of operations, starting with a roughing operation, an optional semi-finishing operation, and a finishing operation. In addition to CNC machining, other subtractive manufacturing techniques include electrode discharge machining, chemical machining, waterjet machining, etc. In contrast, additive manufacturing, also known as solid free form fabrication or 3D printing, refers to any manufacturing process where 3D objects are built up from raw material (generally powders, liquids, suspensions, or molten solids) in a series of layers or cross-sections. Examples of additive manufacturing include Fused Filament Fabrication (FFF) and Selective Laser Sintering (SLS). Other manufacturing techniques for building 3D objects from raw materials include casting and forging (both hot and cold).

In addition, CAD software has been designed so as to perform automatic generation of 3D geometry using topology optimization (generative design) for a part or one or more parts in a larger system of parts to be manufactured. This automated generation of 3D geometry is often limited to a design space specified by a user of the CAD software, and the 3D geometry generation is typically governed by design objectives and constraints, which can be defined by the user of the CAD software or by another party and imported into the CAD software. The design objectives (such as minimizing weight of the designed part) can be used to drive the geometry generation process toward better designs. The design constraints can include both structural integrity constraints for individual parts (i.e., a requirement that a part should not fail under the expected structural loading during use of the part) and physical constraints imposed by a larger system (i.e., a requirement that a part not interfere with another part in a system during use). Further, examples of design constraints include maximum mass, maximum deflection under load, maximum stress, etc.

The inputs to a generative design process can include a set of input solids (B-Rep input) that specify boundary conditions for the generative design process, but many modern generative design solvers do not operate directly on the exact surface boundary representation of their input solids. Instead, B-Reps are sampled and replaced with volumetric representations such as level sets or tetrahedral or hexahedral meshes, which are significantly more convenient and efficient for the physical simulations and material synthesis computed by the solver. The set of input solids can include "preserve bodies", which should always be present in the design and which represent interfaces to other parts or locations on which boundary conditions should be applied (for example mechanical loads and constraints). Other regions in which geometry should or should not be generated can also be provided in a similar manner, such as input solids that define "obstacle bodies", which represent regions where new geometry should not be generated.

SUMMARY

This specification describes technologies relating to computer aided design of physical structures using generative design processes, where the three-dimensional (3D) models of the physical structures are produced so as to facilitate manufacturing of the physical structures using 2.5-axis subtractive manufacturing systems and techniques. Subtractive manufacturing techniques can include 2-axis, 2.5-axis, 3-axis or more-axis milling; 2-axis milling cuts through the workpiece without the ability to adjust the height level of the milling head; 3-axis milling cuts through the workpiece while moving the milling tool in three separate dimensions, e.g., simultaneously; 2.5-axis milling can use a 3-axis milling machine, as the milling tool (or combination of the milling tool and the fixture support) can be moved in all three separate dimensions, but during most of the cutting operations, the milling tool is only moved in 2 axes with respect to the workpiece, which results a more efficient manufacturing process.

In general, one or more aspects of the subject matter described in this specification can be embodied in one or more methods (and also one or more non-transitory computer-readable mediums tangibly encoding a computer program operable to cause data processing apparatus to perform operations), including: obtaining (i) a density-based representation of a modeled object for which a corresponding physical structure is to be manufactured using a 2.5-axis subtractive manufacturing process with one or more computer-controlled manufacturing systems, and (ii) data specifying a starting element for each of multiple different subsets of elements in the density-based representation of the modeled object, wherein each of the element subsets has a milling depth, which is one of three or more shared milling depths assigned respectively for three or more discrete layers, each of the three or more discrete layers being perpendicular to a milling direction of the 2.5-axis subtractive manufacturing process, and wherein the density-based representation specifies a three dimensional shape of the modeled object, which has been generatively designed using density-based topology optimization; processing starting elements of the element subsets having milling depths associated with discrete layers below a top most layer of the three or more discrete layers, with respect to the milling direction, the processing including, for a current starting element of the starting elements being processed for a current layer, identifying other starting elements that (i) have element subsets having milling depths associated with a layer above the current layer and (ii) are closer to the current starting element than an amount that is at least equal to a radius of a smallest milling tool available for use with the one or more computer-controlled manufacturing systems, calculating a maximum angular difference between the other starting elements with respect to the current starting element, and moving the milling depth for the element subset of the current starting element to a layer above the current layer by at least changing density values for at least a portion of individual elements in the element subset, in response to the maximum angular difference being greater than a threshold value, to remove a non-manufacturable corner in the modeled object; and providing the three dimensional shape of the modeled object for use in manufacturing the physical structure using the one or more computer-controlled manufacturing systems that employ the 2.5-axis subtractive manufacturing process.

The identifying can include: selecting a starting element to check, wherein the element subset for this selected starting element has a milling depth associated with the layer above the current layer; comparing a centroid of the selected starting element with a centroid of the current starting element; confirming the selected starting element as an identified one of the other starting elements in response to a distance between the centroid of the selected starting element and the centroid of the current starting element being less than the amount, wherein the amount is set equal to the maximum of (i) the radius of the smallest milling tool available and (ii) a predefined fraction of a difference between a bottom of the current layer and the top most layer; and repeating the selecting, the comparing, and the confirming until each of the starting elements having a milling depth associated with the layer above the current layer have been checked.

The calculating can include: finding two dimensional vectors between the current starting element in the current layer and each of the other starting elements with milling depths associated with one or more layers above the current layer; determining a center of gravity vector from the two dimensional vectors; finding a first of the two dimensional vectors having a greatest angle with respect to a direction opposite a direction of the center of gravity vector; finding a second of the two dimensional vectors having a smallest angle with respect to the direction opposite the direction of the center of gravity vector; and subtracting the second of the two dimensional vectors from the first of the two dimensional vectors to produce the maximum angular difference.

Finding the two dimensional vectors can include finding two dimensional vectors between the current starting element in the current layer and each one of all starting elements with milling depths associated with any layer above the current layer.

The identifying, the calculating and the moving can be part of a corner removal process, and the processing can further include a cave-in removal process including, for an additional current starting element of the starting elements being processed for an additional current layer: second identifying additional starting elements that (i) have additional element subsets having milling depths associated with a layer above the additional current layer and (ii) are adjacent to the additional current starting element; second calculating a second maximum angular difference between the additional starting elements with respect to the additional current starting element; and second moving the milling depth for the additional element subset of the additional current starting element to a layer above the additional current layer by at least changing density values for at least a portion of additional individual elements in the additional element subset, in response to the second maximum angular difference being greater than or equal to a second threshold value, to remove a non-manufacturable cave-in in the modeled object.

The threshold value for the maximum angular difference between the other starting elements with respect to the current starting element can be one hundred and ninety five degrees, and the second maximum angular difference can be one hundred and eighty degrees. The corner removal process can be performed sequentially for layers above the current layer beginning with a layer immediately above the current layer, and the cave-in removal process can be performed sequentially for layers above the current layer beginning with the top most layer.

The processing can include repeating the corner removal process and the cave-in removal process until no further moving of milling depths for the element subsets is performed. The milling direction can be a first of two or more milling directions of the 2.5-axis subtractive manufacturing process, the corner removal process and the cave-in removal process can be performed separately for each of the two or more milling directions to produce respective milling-direction-specific data sets, and the processing can include combining the respective milling-direction-specific data sets to update the density-based representation of the modeled object, which has been generatively designed using density-based topology optimization.

The density-based representation of the modeled object can include a non-regular mesh, and obtaining the data specifying a starting element for each of multiple different subsets of elements in the density-based representation of the modeled object can include: sorting the elements in the density-based representation according to positions of centroids of the elements along an axis of the milling direction to form a sorted list of the elements; selecting a next unassigned element in the sorted list to be a next starting element; finding a next set of the elements in the density-based representation having their centroids within a predefined distance from the centroid of the next starting element; assigning the next set of elements to the next starting element to form one of the multiple different subsets of elements in the density-based representation of the modeled object; and repeating the selecting, the finding, and the assigning until no elements in the sorted list remain unassigned.

Obtaining the density-based representation of the modeled object can include iteratively modifying the three dimensional shape of the modeled object in a design space using the density-based topology optimization, one or more design criteria and one or more in-use cases, the iteratively modifying can include adjusting the density-based representation of the generatively designed three dimensional shape in accordance with the milling direction of the 2.5-axis subtractive manufacturing process in at least two iterations of the iteratively modifying, and the adjusting can include the obtaining the data specifying a starting element for each of multiple different subsets of elements in the density-based representation of the modeled object.

Furthermore, the providing can include: generating toolpath specifications for a subtractive manufacturing machine, in accordance with the 2.5-axis subtractive manufacturing process, using the three dimensional shape of the modeled object; and manufacturing at least a portion of the physical structure, or a mold for the physical structure, with the subtractive manufacturing machine using the toolpath specifications.

One or more aspects of the subject matter described in this specification can also be embodied in one or more systems including: a non-transitory storage medium having instructions of a computer aided design program stored thereon; and one or more data processing apparatus configured to run the instructions of the computer aided design program to perform any of the one or more methods described herein. The one or more systems can further include a 2.5-axis subtractive manufacturing machine or other subtractive manufacturing machine that can perform a 2.5-axis subtractive manufacturing process, such as a 3-axis or a multi-axis (e.g., 4, 5, 6, 7, 8 or 9 axes) subtractive manufacturing machine.

Particular embodiments of the subject matter described in this specification can be implemented to realize one or more of the following advantages. Non-manufacturable corners and/or cave-ins (i.e., narrow channels) can be readily removed from a 3D model of an object that has been generatively designed, e.g., using topology optimization, for 2.5-axis machining by being limited to discrete layers. The removal process can check for tool interference without requiring boundary surface information by operating on data for a density-based representation of the 3D model (a 3D mesh model, in which a density value is defined for each element in the 3D mesh). The removal process can be applied to a 3D mesh model that has been generatively designed for 2.5-axis machining in two or more milling directions, in which case the 3D model has separate (but intersecting) discrete layers defined for the different milling directions. The produced designs can be built using a multi-axis CNC machine, allowing the multiple milling directions to be used without having to re-position and re-anchor the workpiece, which can further reduce the time needed to manufacture the part, above and beyond the time saved by using 2.5-axis milling. In some implementations, a generative design algorithm can be improved by using the disclosed method(s) of adjusting (projecting) design variables, such that the final product can be manufactured by 2.5-axis machine, where the provided sensitivity information can quantify how much the objective(s) and constraint(s) can be changed due to the adjustment.

Moreover, the removal process (which fixes any unreachable corners and/or cave-ins) can ensure that the volume of the 3D model will always increase (or at least stay the same) without making the 3D model thinner in any location, thus avoiding any negative impact on part performance. Also, any increase in volume will be small compared to the overall volume of the model, so any minimized volume objective or constraint will still be generally satisfied by the final 3D model after non-manufacturable portions of fixed by the removal process. Note that this makes the approach conservative in the sense that more material can be added, but the total volume of material cannot be reduced, as a result of imposing the tool-size check.

The details of one or more embodiments of the subject matter described in this specification are set forth in the accompanying drawings and the description below. Other features, aspects, and advantages of the invention will become apparent from the description, the drawings, and the claims.

BRIEF DESCRIPTION OF THE DRAWINGS

FIG. 8A shows an example of a starting element array for a 3D model designed for manufacturing using a 2.5-axis manufacturing process.

FIGS. 8B-8D show examples of tool intersection for different elements.

FIG. 8E shows an example of defining the starting vector of angle calculation.

FIG. 8F shows an example of a cave-in element, which cannot be machined, being identified.

Like reference numbers and designations in the various drawings indicate like elements.

DETAILED DESCRIPTION

Figure 1A:
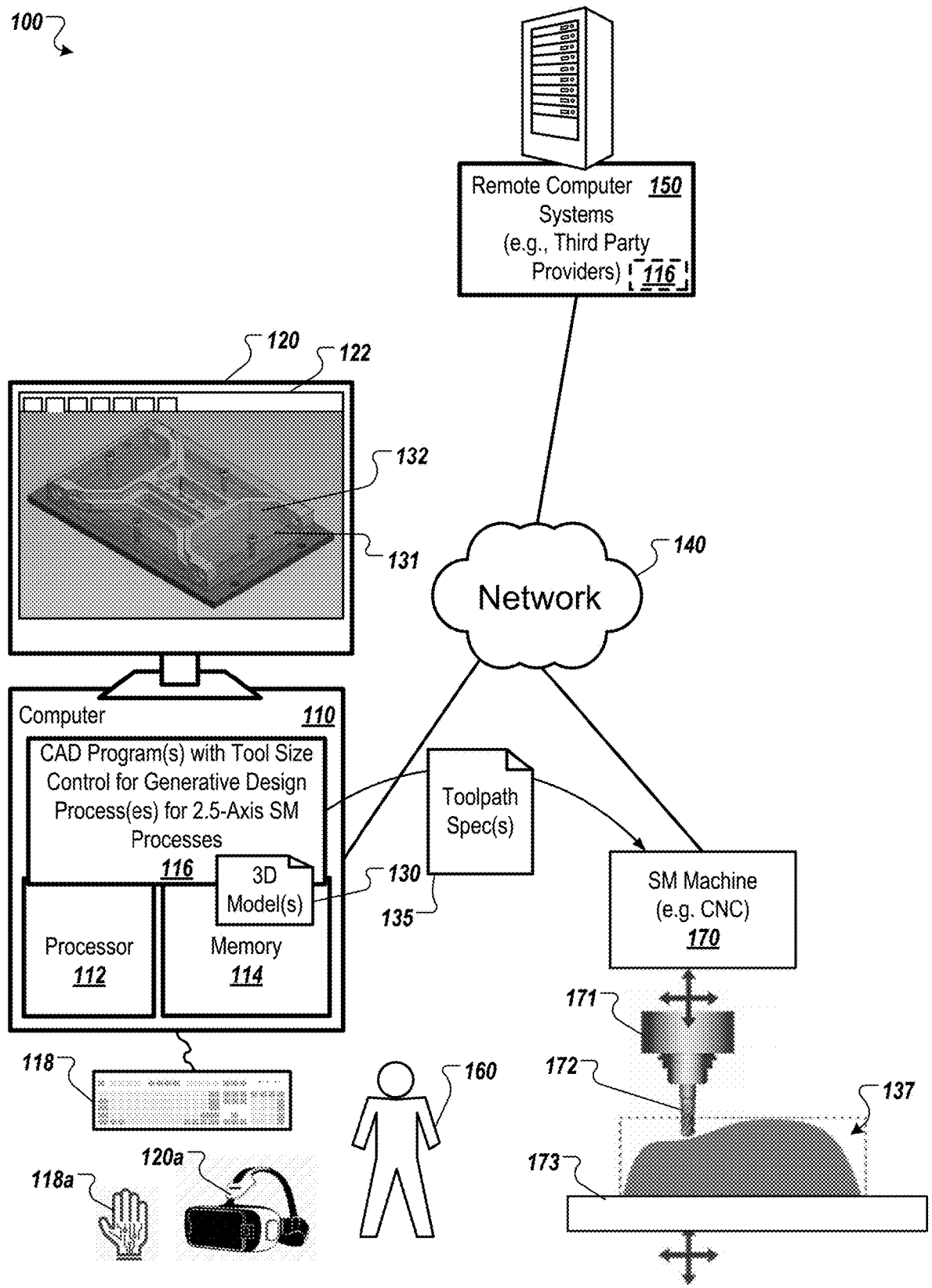
FIG. 1A shows an example of a system usable to provide tool size control for generative design to produce physical structures that are tailored for manufacturing with a 2.5-axis subtractive manufacturing process.

FIG. 1A shows an example of a system 100 usable to provide tool size control for (and potentially determine layer boundaries during) generative design to produce physical structures that are tailored for manufacturing with a 2.5-axis subtractive manufacturing process. A computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112, including Computer Aided Design (CAD) program(s) 116, which implement three-dimensional (3D) modeling functions and can include one or more generative design processes for topology optimization (e.g., using at least one Solid Isotropic Material with Penalization (SIMP) method) with numerical simulation. The numerical simulation performed by the systems and techniques described in this document can simulate one or more physical properties and can use one or more types of simulation to produce a numerical assessment of physical response (e.g., structural response) of the modelled object. For example, finite element analysis (FEA), including linear static FEA, finite difference method(s), and material point method(s) can be used. Further, the simulation of physical properties can include Computational Fluid Dynamics (CFD), Acoustics/Noise Control, thermal conduction, computational injection molding, electric or electro-magnetic flux, material solidification (which is useful for phase changes in molding processes) simulations, linear transient dynamic analysis, normal mode analysis, buckling analysis, and/or heat transfer analysis.

As used herein, CAD refers to any suitable program used to design physical structures that meet design requirements, regardless of whether or not the program is capable of interfacing with and/or controlling manufacturing equipment. Thus, CAD program(s) 116 can include Computer Aided Engineering (CAE) program(s), Computer Aided Manufacturing (CAM) program(s), etc. The program(s) 116 can run locally on computer 110, remotely on a computer of one or more remote computer systems 150 (e.g., one or more third party providers' one or more server systems accessible by the computer 110 via the network 140) or both locally and remotely. Thus, a CAD program 116 can be two or more programs that operate cooperatively on two or more separate computer processors in that one or more programs 116 operating locally at computer 110 can offload processing operations (e.g., generative design and/or numerical simulation operations) "to the cloud" by having one or more programs 116 on one or more computers 150 perform the offloaded processing operations. In some implementations, all generative design operations are run by one or more programs in the cloud and not in the B-Rep solid modeler that runs on the local computer. Moreover, in some implementations, the generative design program(s) can be run in the cloud from an API (Application Program Interface) that is called by a program, without user input through a graphical user interface.

The CAD program(s) 116 present a user interface (UI) 122 on a display device 120 of the computer 110, which can be operated using one or more input devices 118 of the computer 110 (e.g., keyboard and mouse). Note that while shown as separate devices in FIG. 1A, the display device 120 and/or input devices 118 can also be integrated with each other and/or with the computer 110, such as in a tablet computer (e.g., a touch screen can be an input/output device 118, 120). Moreover, the computer 110 can include or be part of a virtual reality (VR) and/or augmented reality (AR) system. For example, the input/output devices 118, 120 can include a VR/AR input glove 118a and/or a VR/AR headset 120a. In any case, a user 160 interacts with the CAD program(s) 116 to create and modify 3D model(s), which can be stored in 3D model document(s) 130.

An initial 3D model can be an input to a generative design process. The initial 3D model can be set of preserve bodies and potentially obstacle bodies. The input preserve geometry can be unconnected modelled solids, where the generative design process is used to produce new 3D geometry that connects the input preserve solids. A design space 131 can be obtained by determining a bounding volume or a convex hull for the input model, or another technique can be used to obtain the design space 131, which is the volume of space inside which the part is to be designed during topology optimization. In some cases, the user may explicitly specify a solid body as the design space 131.

The user 160 can define a topology optimization problem for a generative design process to produce a desired 3D model from a starting 3D model, or the input can be a design space 131 without a specific initial 3D model. For example, the design space 131 can be a box-shaped domain in which a density field is defined (with $n_x$ by $n_y$ by $n_z$ elements). In general, the input design space 131 can be automatically generated or user specified, the design space 131 can include one or more non-design regions in addition to design regions, and each different region can have different initial volume fractions, different minimum member sizes, different design criteria (e.g., different manufacturing constraints), and model dependent defaults.

As described herein, in some implementations, the CAD program(s) 116 implement at least one generative design process, which enables the CAD program(s) 116 to generate one or more portions of a 3D model (or the entirety of a 3D model) automatically based on design objective(s) and constraint(s), i.e., design criteria, where the geometry of the design is iteratively optimized based on simulation feedback. Note that, as used herein, "optimization" (or "optimum" or "optimizer") does not mean that the best of all possible designs is achieved in all cases, but rather, that a best (or near to best) design is selected from a finite set of possible designs that can be generated, e.g., within an allotted time given the available processing resources and/or in view of competing objectives for the optimization process.

The design criteria can be defined by the user 160, or by another party and imported into the CAD program(s) 116. The design criteria can include structural integrity constraints for individual parts (e.g., a requirement that a part should not fail under the expected structural loading during use of the part) and physical constraints imposed by a larger system (e.g., a requirement that a part be contained within a specified volume so as not to interfere with other part(s) in a system during use; assemblies with linear contact can be supported by the CAD software). One or more of the design criteria (e.g., a stress constraint) can be defined over entire regions in the design space 131 or over individual regions in the design space 131. The design criteria can also include a desired 2.5-axis subtractive manufacturing process to be facilitated (e.g., using a 2.5 axis CNC machine, or 3-axis or multi-axis CNC machine, with specified types and sizes of tools).

Note that the "2.5 dimension" in machining refers to a plane which is a projection of a surface into one coordinate axis. In 3D space, the planes of a 2.5-axis subtractive manufacturing process are parallel to the x-y plane with respect to machining, but with different z-coordinates. These planes are defined with different heights, and 2.5-axis milling is a process in which materials are cut according to a shape defined in the 2.5 dimension. This is a popular machining process as it is easy to generate G-code with optimal tool paths for such shapes. Further, a 2.5 axis CNC machine has the capability to translate in all three axes but can perform the cutting operation only in two of the three axes at a time due to hardware and/or software limitations, e.g., the machine has a solenoid instead of a true, linear z-axis. A typical example involves an x-y table that positions for each hole center, where the spindle (z-axis) then completes a fixed cycle for drilling by plunging and retracting axially. The code for a 2.5-axis machining is significantly less than 3-axis contour machining, and the software and hardware requirements are (typically) less expensive. Drilling and tapping centers are relatively inexpensive (e.g., limited-duty machining centers that began as a 2.5-axis market category) although many late-model ones are 3-axis because the software and hardware costs have dropped with advancing technology.

Various generative design processes can be used, which can optimize the shape and topology of at least a portion of the 3D model. The optimization of the geometric design of the 3D model(s) by the CAD program(s) 116 involves topology optimization, which is a method of light-weighting where the optimum distribution of material is determined by minimizing an objective function subject to design constraints (e.g., structural compliance with volume as a constraint). There are two primary categories of topology optimization, density-based approaches and boundary-based approaches. Density-based approaches (e.g., SIMP or homogenized methods) discretize the volume of the part into individual elements, and assign a density to each discrete element. Then the densities are driven toward solid and empty while minimizing the objective(s) subject to the constraints. Boundary-based approaches instead track the shape of the external interface of the solid part and move the boundary such that the constraints are satisfied and the objective(s) are minimized, such as in a level-set method.

As described herein, a density-based topology optimization process can guide the generative design process to produce a final shape for the design that facilitates manufacture of the physical structure using a 2.5-axis manufacturing process, which employs two or more z-depth planes (the 2.5 dimensions), where the machine tool stays at a z-axis position for each respective plane while the machine tool moves in the x-y plane. To achieve this goal, the generative design process can determine the z-depth planes (i.e., the boundaries between the different layers of the 3D model) and optionally the number of z-depth planes, and the generative design process can use this determined information during the density-based topology optimization.

Note that the shape synthesis process is done using a density-based representation of the generatively designed 3D shape of the modeled object, but the CAD program(s) 116 will typically use a different representation of the geometry for 3D modelling. For example, the geometry generation engine of the generative design process (e.g., implemented in CAD program(s) 116) employs a density-based representation (e.g., density values associated with a voxel or tetrahedral mesh) while the CAD program(s) 116 can use a B-Rep model for any input geometry as well as for final geometry of a 3D model 132 produced using the generative design process. In some implementations, the density-based topology optimization in the generative design process uses a regular finite element grid, and the density of every element is controlled by an associated design variable.

In addition, regardless of the specific density-based topology optimization process used and how layer boundaries are determined, tool size control can be provided for the generative design to ensure tool access during manufacturing using the 2.5-axis manufacturing process. Further details regarding the generative design process(es) are provided below, in connection with FIGS. 1B-5. Further details regarding providing tool size control are provided below, in connection with FIGS. 1B, 2, 5, and 7A-9E.

Once the user 160 is satisfied with a generatively designed 3D model 132, the 3D model 132 can be stored as a 3D model document 130 and/or used to generate another representation of the model (e.g., toolpath specifications for a 2.5-axis subtractive manufacturing process). This can be done upon request by the user 160, or in light of the user's request for another action, such as sending the generatively designed 3D model 132 to a subtractive manufacturing (SM) machine 170, or other manufacturing machinery, which can be directly connected to the computer 110, or connected via a network 140, as shown. This can involve a post-process carried out on the local computer 110 or a cloud service to export the 3D model 132 to an electronic document from which to manufacture. Note that an electronic document (which for brevity will simply be referred to as a document) can be a file, but does not necessarily correspond to a file. A document may be stored in a portion of a file that holds other documents, in a single file dedicated to the document in question, or in multiple coordinated files. In addition, the user 160 can save or transmit the 3D model 132 for later use. For example, the CAD program(s) 116 can store or send the document 130 that includes the generated 3D model 132.

The CAD program(s) 116 can provide a document 135 (having toolpath specifications of an appropriate format) to the SM machine 170 to create a complete structure from stock material 137, where the physical structure includes the optimized topology and shape that facilitates 2.5-axis machining, a staircase-like design generated for 2.5-axis milling. The SM machine 170 can employ one or more subtractive manufacturing techniques, e.g., a Computer Numerical Control (CNC) milling machine, such as a multi-axis, multi-tool milling machine. The SM machine 170 can be a 2.5-axis CNC machine, where the freedom of movement of the spindle 171 and attached tool 172 (e.g., a rotary cutter or router selected from a set of available tools) is limited to the x-y plane for most milling, and only moves in the z direction in discrete steps.

However, the SM machine 170 can also be a 3-axis CNC machine, where the spindle 171 has full freedom of movement in each of the x, y and z dimensions, i.e., the tool 172 can move in all three axes simultaneously. A 2.5-axis milling process can be performed with a 3-axis milling machine and need not use any of the features of the higher-axis machine because a 2.5D image is a simplified three-dimensional (x, y, z) surface representation that contains at most one depth (z) value for every point in the (x, y) plane. Thus, the SM machine 170 can also be a multi-axis machine, where the tool 172 can translate in three axes (x, y, z) and rotate in two axes (roll and yaw) simultaneously while cutting a workpiece 137. Note that these additional freedoms of movement can be effected by computer controlled motion of the spindle 171, computer controlled motion of a clamp or anchor point (e.g., machine table) 173 for the part being machined, or both in combination. Nonetheless, due to the production of a 2.5-axis design, the advanced capabilities of a 3-axis or multi-axis machine need not be used, either at all, or for most of the milling operations.

Even when the SM machine 170 is not specifically a 2.5-axis machine, using a 2.5-axis subtractive manufacturing process is advantageous. This is due the fact that, performing cutting operations in only 2 dimensions at a time makes it simpler to generate the toolpath specification (e.g., G-code) closer to an optimal cutting tool path design. Designing the part to have a layered or staircase shape can result in more rapid programming of the subtractive machine toolpaths. Further, by limiting the milling tool's movement to 2 axes during most of the cutting operations (the subtractive process occurs with continuous movement in the plane perpendicular to the milling tool, but in discrete steps parallel to the milling tool) the efficiency of the manufacturing process can be improved, i.e., shorter machining time, as the 2.5-axis subtractive manufacturing process can rapidly remove layers of material in sequence and create parts that often have a series of "pockets" at varying depths. Moreover, since 2.5-axis machining equipment is both more commonly available and less expensive than 3-axis and 5-axis machining equipment, providing the CAD program(s) 116 with generative design process(es) that can limit designs to 2.5-axis manufacturable parts increases the practical usability of the generative design process(es).

In any case, the CNC machine 170 should in some way anchor the stock during machining to prevent unintended movement, and sometimes the location of the anchoring of the stock should be changed (by a human operator or by other methods exist) so that portions of the stock which were previously used in the anchoring process can be exposed for subsequent cutting by the CNC machine 170. These orientations or arrangements of the part and its anchor are known as "part setups". In light of the ability to rotate the workpiece (by employing different part setups generally, or by rotating the tool or the table to which the workpiece is anchored in a multi-axis CNC machine) or the ability to rotate the tool (in a multi-axis CNC machine, but not in a 2.5-axis CNC machine) multiple milling directions can be used.

Thus, regardless of the degrees of freedom of movement and the anchoring capabilities of the SM machine 170, the SM machine 170 can perform a 2.5-axis machining process in that the tool moves in two axes synchronously while the tool moves in a third axis incrementally to create a series of "tiers" in the part geometry. The walls and floor of each tier can be cut by the sides and end of the tool, respectively, which is more efficient than contoured ("3-axis") surfaces. At the same time, 2.5-axis machining provides improved control of the geometry over 2-axis machining, in which the tool always cuts all the way through the part. Because the generative design process(es) in the CAD program(s) 116 produce 2.5-axis compatible geometries, this results in significant savings in programming time and machining time for the SM machine 170, as a result of using the simpler geometry for the part, even if the SM machine 170 could handle more complicated geometry for the part.

Figure 1B:
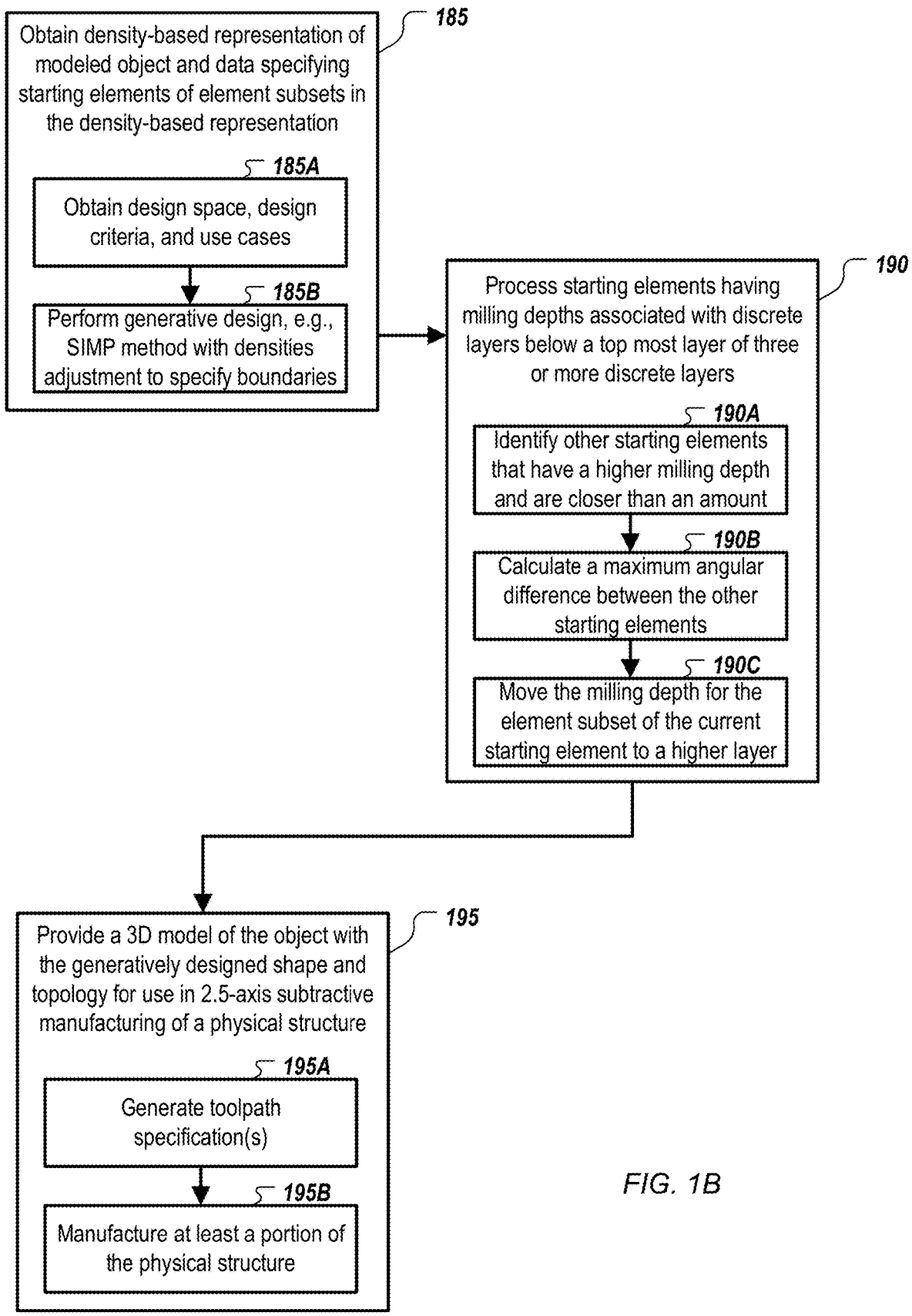
FIG. 1B shows an example of a process performed for generative designs with determined layer boundaries to ensure tool access during manufacturing physical structures using a 2.5-axis subtractive manufacturing process.

FIG. 1B shows an example of a process performed for generative designs with determined layer boundaries to ensure tool access during manufacturing physical structures using a 2.5-axis subtractive manufacturing process. A density-based representation of a modeled object, and data specifying starting elements of element subsets in the density-based representation, are obtained 185, e.g., by CAD program(s) 116. The density-based representation is of the modeled object, for which a corresponding physical structure is to be manufactured using a 2.5-axis subtractive manufacturing process with one or more computer-controlled manufacturing systems, as described in this document. Further, the data is data specifying a starting element for each of multiple different subsets of elements (e.g., milling lines) in the density-based representation of the modeled object.

In some implementations, obtaining 185 the density-based representation and the data specifying starting elements can involve receiving the density-based representation and the data specifying the starting elements from another process. In some implementations, obtaining 185 the density-based representation and the data specifying starting elements can involve generating the density-based representation and the data specifying the starting elements.

For example, the obtaining 185 can involve obtaining 185A, e.g., by CAD program(s) 116, a design space for an object, one or more design criteria and one or more in-use cases for use in producing a generative 3D model of a physical structure to be manufactured using a 2.5-axis subtractive manufacturing process. The design space for the modelled object is the volume inside which the part is to be designed. The design space can include a bounding volume containing an initial specification of one or more outer shapes of the three dimensional topology for the object. As noted above, the design space can include 3D model(s), designed in or loaded into CAD program(s) 116, that serves as a sub-space of an optimization domain of a generative design process, and/or a set of input solids that specify boundary conditions for generative design geometry production, e.g., B-Reps selected using UI 122 to specify sub-space(s) that are preserved for use as connection point(s) with other component(s) in a larger 3D model or separate 3D model(s).

The design criteria can include design objective(s) and design constraint(s) for the object. Design objectives can include but are not limited to minimizing waste material, minimizing weight of the part, minimizing compliance or maximizing stiffness, minimizing stress, and/or minimizing or maximizing other intrinsic properties of the part, and are used to drive the shape synthesis process towards better designs. Though not required, it is typical for a design objective to be rooted in a simulation of the design, e.g., linear static, fluid dynamic, electromagnetic, etc. Design constraints can include a variety of geometric and physical characteristics or behaviors that should be met in any generated design (requirements either on individual parts or on the entire assembly are also admissible); examples include maximum mass, maximum deflection under load, maximum stress, etc.

Further, different generative design processes can be formulated by using different combinations of design parameters and design variables. In some implementations, the design parameters can include various types of inputs, received through UI 122, such as selection among different generative design synthesis methods made available by CAD program(s) in the system 100. In some implementations, the available generative design synthesis methods can include a SIM' method that provides a density-based method of topology optimization. Other generative design synthesis methods are also possible and can be provided by CAD program(s) 116 in the system 100. Different combinations of design parameters and design variables can be used, e.g., by CAD program(s) 116, in response to input from the user 160. For example, a user 160 may select different generative design synthesis methods to use within respective different design spaces within a single 3D model.

Further, the obtained 185A one or more in-use cases are for the physical structure that will be manufactured from the generatively designed part using a 2.5-axis subtractive manufacturing process. The one or more in-use cases can include one or more loads that are expected to be supported by the physical structure, and can be associated with a setup for numerical simulation, e.g., densities of elements in an FEA model to be used with an optimized 3D topology of the part being generatively designed. However, as used herein, "in-use cases" refers generally to separate operational constraints under which part performance is evaluated and correspond to one or more sets of boundary conditions for various types of physics simulations, such as fluid flow simulation, electro-magnetic (EM) behavior simulation, mutliphysics simulation, etc.

In general, the setup for numerical simulation can include one or more physical properties to be simulated and one or more types of simulation to be performed, as well as potentially surrogate modelling or other methods of approximation. In some implementations, the type of numerical simulation is predefined, either for all uses of the program or given a particular context in the program from which the generative design process has been launched. Further, the setup for numerical simulation can include at least one set of loading conditions and/or other physical environment information associated with the type of numerical simulation to be performed, i.e., the in-use case(s).

With the generative design space and design criteria specified, one or more 3D model(s) can be produced 185B, e.g., by CAD program(s) 116, using one or more generative design processes, where the physical structure(s) corresponding to these 3D model(s) are designed to be manufactured using a 2.5-axis subtractive manufacturing process. The one or more generative design processes performed, e.g., by CAD program(s) 116, include at least one density-based generative design process, e.g., using a SIMP method, which involve iteratively modifying, e.g., by CAD program(s) 116, a generatively designed three dimensional shape of the modeled object. This includes modifying both a geometry of the three dimensional shape and a topology of the three dimensional shape in the design space in accordance with the one or more design criteria and the one or more in-use cases. In particular, the process 185B can produce optimal topology designs that minimize objective functions while satisfying multiple constraints, where the designs are compatible with 2.5-axis machining. The iterative updating to the 3D shape and topology of the generative design in the process 185B continues until the generative design satisfies all constraint(s) and minimizes (or maximizes) the objective(s).

The production 185B of the 3D model(s) can include adjusting the density-based representation of the generatively designed three dimensional shape in accordance with one or more milling directions of the 2.5-axis subtractive manufacturing process. The adjusting can occur throughout the iterative modification of the 3D shape, in only some of the iterations of the iteratively modifying, or after the iterative modification of the topology optimization has ended. But regardless of whether or not the adjusting is done in the topology optimization loop, the adjusting specifies boundaries between three or more discrete layers for the object, and one or more generative 3D models are produced that are compatible with a 2.5-axis subtractive manufacturing process.

Such 3D models have discrete layers corresponding to the 2.5-axis subtractive manufacturing process, where the discrete layers create flat areas in the one or more 3D model(s) that facilitate manufacturing of the corresponding physical structure(s) by facilitating flank milling (removing stock material using the side or flank of the tool) and end face milling (removing stock material using the end or face of the tool). Note that even though 2.5-axis manufacturability need not be implemented as a formal constraint within the topology optimization process, the iterative modification 185B of the generatively designed 3D shape of the modelled object effectively constrains the geometry generation process to produce shapes that can be manufactured using 2.5-axis machining.

Other approaches are also possible for obtaining 185 the density-based representation and the data specifying starting elements. But regardless of whether these are received or generated, each of the element subsets has a milling depth, which is one of three or more shared milling depths assigned respectively for three or more discrete layers, each of the three or more discrete layers being perpendicular to a milling direction of the 2.5-axis subtractive manufacturing process, and the density-based representation specifies a three dimensional shape of the modeled object, which has been generatively designed using density-based topology optimization. With this data available, starting elements of the element subsets that have milling depths associated with discrete layers below a top most layer of the three or more discrete layers (with respect to the milling direction) are processed 190, e.g., by CAD program(s) 116.

The processing 190 can be performed for each starting element in turn (i.e., a current starting element of the starting elements being processed for a current layer) and includes the following operations. Other starting elements that (i) have element subsets having milling depths associated with a layer above the current layer, and (ii) are closer to the current starting element than an amount, are identified 190A, e.g., by CAD program(s) 116. The amount is at least equal to a radius of a smallest milling tool available for use with the one or more computer-controlled manufacturing systems. Further details regarding determining the amount are provided below in connection with FIGS. 7A-8E and 9C. A maximum angular difference between the other starting elements is calculated 190B with respect to the current starting element. Further details regarding calculating the maximum angular difference are provided below in connection with FIGS. 9C-9E. Finally, the milling depth for the element subset of the current starting element is moved 190C, e.g., by CAD program(s), to a layer above the current layer by at least changing density values for at least a portion of individual elements in the element subset, in response to the maximum angular difference being greater than a threshold value, to remove a non-manufacturable corner in the modeled object. Further details regarding changing milling depths to remove non-manufacturable corners and non-manufacturable cave-ins (i.e., narrow channels) are provided below in connection with FIGS. 7A-8E, 9A, 9C and 9D.

Note that the processing 190 can also be included within the generative design process that produces the generatively designed 3D shape of the modeled object. For example, the processing 190 can be included within the generative design process 185B. The processing 190 can occur throughout the iterative modification of the 3D shape, in only some of the iterations of the iteratively modifying, or after the iterative modification of the topology optimization has ended. But regardless of whether or not the processing 190 is done in the topology optimization loop, the processing 190 reassigns milling depths among three or more discrete layers for the object to improve manufacturability (e.g., ensure tool accessibility) for the generative 3D model compatible with a 2.5-axis subtractive manufacturing process.

In some implementations, the result of generative design processing is presented to the user, e.g., in UI 122 on display device 120, along with an option to accept or reject the design. In some implementations, the user can select from the final design or any of a variety of previous iterations for each design study. In some implementations, two or more 3D models resulting from the generative design process can be presented to the user along with a trade-off analysis of design complexity versus cost of manufacturing (or any of a variety of other quantities of interest). The trade-off analysis can assist a user 160 in deciding whether to accept or reject one or more 3D models among the presented 3D models.

If the design is rejected, the process of FIG. 1B can return to obtain 185A, e.g., by CAD program(s) 116, a new design space and/or new design criteria for use in producing a new generative 3D model. Once a design in not rejected, the process of FIG. 1B can provide 195, e.g., by CAD program(s) 116, the 3D model of the object with the generatively designed shape and topology for use in 2.5-axis subtractive manufacturing of a physical structure. The providing 195 can involve sending or saving the 3D model to a permanent storage device for use in manufacturing the physical structure corresponding to the object using SM manufacturing systems. In some implementations, the providing 195 involves generating 195A, e.g., by CAD program(s) 116, toolpath specifications for the computer-controlled SM manufacturing system(s) using the 3D model, and manufacturing 195B, e.g., by CAD program(s) 116, at least a portion of the physical structure corresponding to the object with the computer-controlled SM manufacturing system(s) using the toolpath specifications generated for 2.5-axis SM machining. In some implementations, the providing 195 can include manufacturing a mold for a physical structure with 2.5-axis subtractive machining using the toolpath specification generated 195A, where the 3D model can be a model of the mold that will be manufactured using a 2.5-axis subtractive manufacturing process.

The 3D model that is provided 195 is the 3D model that is processed 190, either in connection with a generative design synthesis method or in connection with post-processing of the generative design output. For example, in some implementations, a 3D mesh model produced by a generative design synthesis method is processed 190 to improve manufacturability (e.g., remove non-manufacturable corners and non-manufacturable cave-ins) as a final, tool-size condition local fix of the 3D model, and then the 3D model can be converted into a watertight B-Rep 3D model, before being provided 195. In some implementations, a polygon mesh, which can be extracted from the output of the density-based generative design process, or generative design data obtained directly from the density-based generative design process, can be converted into a boundary representation (B-Rep) model and/or a parametric feature model, e.g., by CAD program(s) 116. The boundary representation model or the parametric feature model can be editable, e.g., as sketch geometry with parametric features.

Thus, the method(s) described in this document can be implemented, e.g., in CAD program(s) 116, to provide both (1) substantial user control over the generative design process, and (2) control functions for providing the generatively designed 3D model for use in manufacturing a physical structure corresponding to the object, in addition to processing the density-based representation of the 3D model to account for tool access during manufacturing using a 2.5-axis manufacturing process, and potentially determining the boundaries of discrete layers for the 3D model for the 2.5-axis manufacturing process. In any case, the goal is to produce a 3D model of an object that facilitates 2.5-axis subtractive manufacturing of the object.

Figure 2:
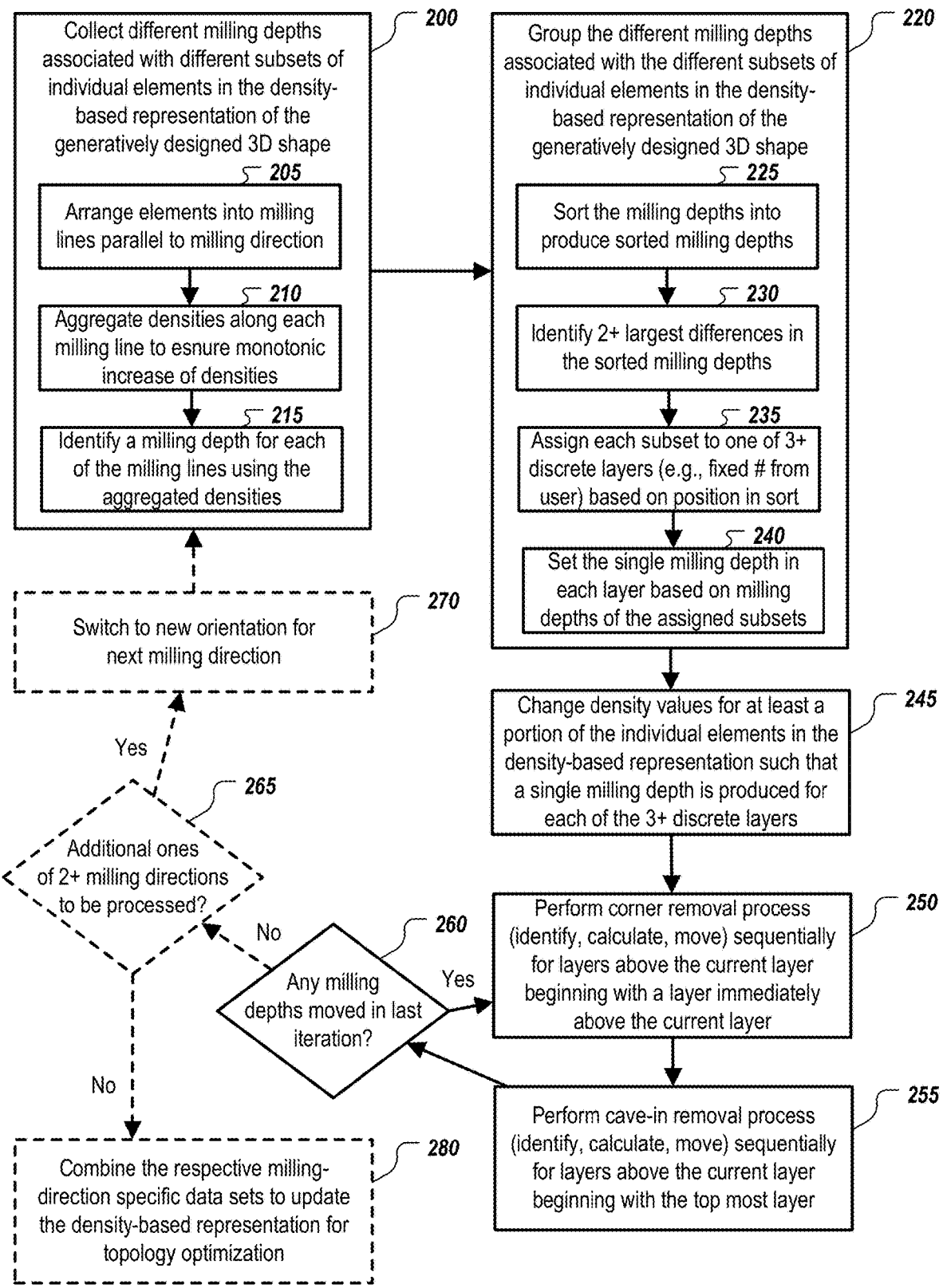
FIG. 2 shows an example of a process of adjusting a density-based representation of a generatively designed three dimensional shape in accordance with one or more milling directions of a 2.5-axis subtractive manufacturing process.

FIG. 2 shows an example of a process of adjusting a density-based representation of a generatively designed three dimensional shape in accordance with one or more milling directions of a 2.5-axis subtractive manufacturing process. The process of FIG. 2 includes an example of the processing 190 and also includes an example of the adjusting in the generative design process 185B from FIG. 1B. The process of FIG. 2 includes collecting 200 different milling depths associated with different subsets of individual elements in the density-based representation of the generatively designed three dimensional shape.

The collecting 200 can include arranging 205 individual elements in the density-based representation of the generatively designed three dimensional shape into milling lines parallel to the milling direction, where each of the milling lines corresponds to one of the different subsets of the individual elements. For example, milling arrays can be defined directly on the physical domain of the density-based representation. Note that a virtual embedding domain (in which the milling process is established) and interpolation of the physical model (within the virtual domain using coordinate transformation and mapping) are not needed.

Figure 3A:
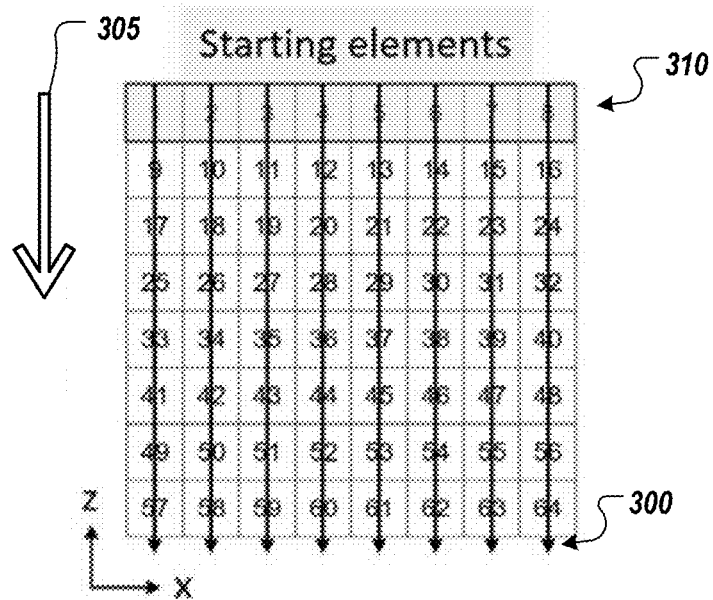
FIG. 3A shows an example of arranging elements in milling lines.

FIG. 3A shows an example of arranging elements in milling lines. In the example shown, it is presumed that the milling direction is in the negative z-coordinate direction. Arrows 300 represent the milling lines, which are parallel to the milling direction 305 of the tool. In each milling line 300, the first element 310 that the tool touches is referred to as a starting element. In some implementations, the arranging 205 involves identifying the starting elements based on the milling direction 305, establishing a milling line for each identified starting element, finding which of the remaining elements are intersected by each milling line, and storing the sequence of elements along each milling line in an array.

Note that the presumption that the milling direction is the negative z-coordinate direction is merely for ease of presentation, and various different milling directions can be used, e.g., a 45-degree angled milling direction for 3-axis or multi-axis milling. Further, the numbers 1-64 in the elements shown in FIG. 3A represent finite elements in a regular Cartesian grid mesh. If the domain is in a rectangle or a cuboid box, the starting elements can be determined based on their coordinates or the surface that they belong to. The algorithm can be much simpler if all elements are ordered starting from the lowest coordinate value and increase in the x-direction first, the y-direction next, and then the z-direction last. In such implementations, if the number of elements in x-, y- and z-directions are known, then finding the starting elements is straight forward.

In implementations where the elements are not so ordered, an adjacency array and milling direction array can be used to find the starting elements and the following elements in sequence along each milling line. In some implementations, the mesh is searched based on element coordinate and location to find those elements that come next in the current sequence along a milling line. In some cases, the user, the geometry modeler or a pre-processor stage can provide the (non-traditional) element sequencing from which the milling line intersections and adjacent elements can be found. In addition, in some implementations, symmetry is taken into account, and the milling direction should be toward or parallel to the symmetry plane(s). For example, when the y-plane is a symmetry plane, the milling direction cannot be in the positive y-coordinate direction.

Thus, while the example presented in FIG. 3A represents a regular Cartesian grid mesh, using finite elements in a regular Cartesian grid mesh is not required. Each mesh element need not be a square (2D) or a cube (3D). Each mesh element can be rectangular (2D) and rectangular cuboid (3D). Moreover, some implementations will operate on other types of mesh elements and mesh types, such as a mesh composed of tetrahedral elements and/or an unstructured mesh. For example, for a non-regular mesh, the element center coordinate can be used to determine if an element belongs to a specific milling line, and since the element center coordinate may not be on the milling line, a tolerance value can be used to determine acceptance of the element as belonging to the milling line. In general, for a given mesh and a given milling direction, all elements can be arranged in milling lines with a unique starting element per each milling line. Moreover, the 2.5-axis milling condition can be applied with various types of constraints, such as minimum member size and maximum member size.

Returning to FIG. 2, the collecting 200 can further include aggregating 210 densities of elements along each of the milling lines such that the aggregated densities of the elements monotonically increase along each of the milling lines up to a maximum value of one or another maximum value, e.g., a user provided value. The aggregating 210 can include accumulating the density values along the milling line and projecting the accumulated density values, as described below. Note that the following derivations only consider a single milling line, but the same process can be applied to each of the milling lines.

The initial densities, $\rho_i$ (i=1, . . . , N), are referred to as blue-print densities. These are design variables used in optimization. Then, along the tool direction, densities are accumulated as shown in Table 1 below.

TABLE 1

| Blue print densities | | | | | | | |
| --- | --- | --- | --- | --- | --- | --- | --- |
| $\rho_1$ | $\rho_2$ | $\rho_3$ | $\rho_4$ | $\rho_5$ | $\rho_6$ | $\rho_7$ | $\rho_8$ |
| Accumulated densities | | | | | | | |
| $\rho_1$ | $\rho_1 + \rho_2$ | $\rho_1 + \rho_2 + \rho_3$ | $\rho_1 + \rho_2 + \rho_3 + \rho_4$ | $\rho_1 + \rho_2 + \rho_3 + \rho_4 + \rho_5$ | $\rho_2 + \rho_3 + \rho_4 + \rho_5 + \rho_6$ | $\rho_3 + \rho_4 + \rho_5 + \rho_6 + \rho_7$ | $\rho_4 + \rho_5 + \rho_6 + \rho_7 + \rho_8$ |

The accumulated densities can be written as:

$$\tilde{\rho}_i = \sum_{k=1}^{i} \rho_k, i = 1, \ldots, N \quad (1)$$

Thus, the first element in each milling line keeps its own density, the second element gets the sum of the first and second elements, the third element gets the sub of the first, second and third elements, etc. This accumulation process guarantees that the densities monotonically increase along the tool direction. Therefore, it prevents the creation of a hole in the tool path.

However, it is possible that the accumulated densities can be larger than one. In some implementations, in order to make the maximum density be one, a smooth Heaviside step function is applied. When $\tilde{\rho}_i$ is less than a threshold, $\eta$, the projected density becomes zero, otherwise it becomes one. Mathematically, the Heaviside function can be defined as $H(\tilde{\rho}_i - \eta)$ where $H(a)$ is one when $a>0$ and zero when $a<0$. However, since the Heaviside function is non-differentiable, the following form of smoothed Heaviside step function can be utilized:

$$\hat{\rho}_i = H_\eta(\tilde{\rho}_i) = \frac{\tanh(\beta\eta) + \tanh(\beta(\tilde{\rho}_i - \eta))}{\tanh(\beta\eta) + \tanh(\beta(1 - \eta))} \quad (2)$$

where $\beta$ is the parameter to control the approximation. As $\beta \to \infty$, the smoothed Heaviside step function approaches the true step function. In some implementations, $\eta=0.5$ and $\beta=10$, which limits the density between zero and one, and the milling depth can be defined where $\hat{\rho}_i=0.5$. Of course, other values are also possible, including different cutoffs of density value for the milling depth. Nonetheless, for a given milling line, topology densities of elements can be accumulated so that topology densities are monotonically increased along each milling line, and the accumulated densities can be projected such that the maximum density values do not exceed 1.0.

In addition, the collecting 200 can further include identifying 215 a milling depth for each of the milling lines using the aggregated densities in each of the milling lines. For example, using the projected densities, each milling depth can be identified as the location where the density=0.5. In general, the milling depth for each line can be set at an intermediate density value between 0 and 1, e.g., a user provided value.

Figure 3B:
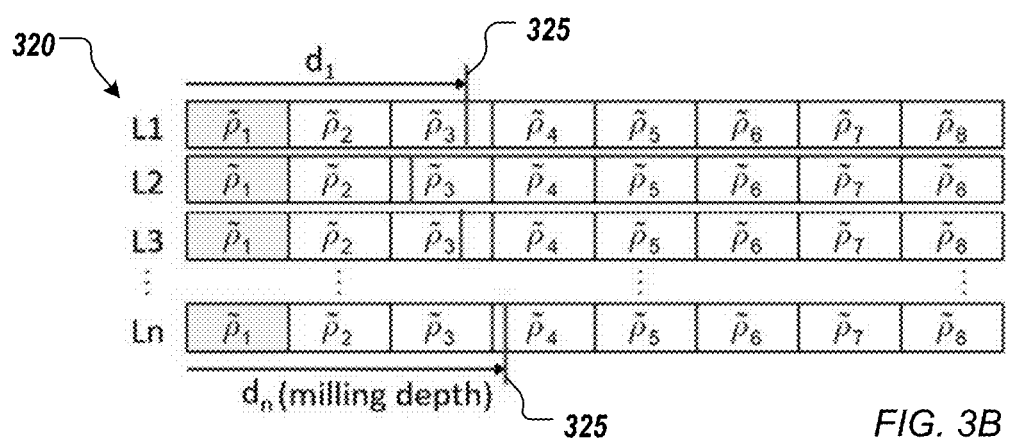
FIG. 3B shows multiple milling lines and their milling depths.

FIG. 3B shows multiple milling lines 320 ($L_1, L_2, \ldots, L_n$) and their milling depths 325 ($d_1, \ldots, d_n$). Because the densities monotonically increase along each milling line, the milling depth for each milling line is defined as the point where the accumulated density passes a common threshold value, e.g., when the accumulated density passes $\tilde{\rho}_i=0.5$, and each different milling line can have a different milling depth. Note that, as the different milling lines have different milling depths, the machine tool will need to cut different heights for different milling lines, i.e., 3 or more-axis milling is still required. These differing milling depths 325 will not work for 2.5-axis milling. To address this issue, the milling lines can be grouped together, and the milling lines within each group can be assigned a same milling depth.

Returning to FIG. 2, the different milling depths can be grouped 220 into respective ones of three or more discrete layers, with each of the three or more discrete layers being perpendicular to the milling direction of the 2.5-axis subtractive manufacturing process. The number of discrete layers can be a user input value that remains fixed during the iterative modification of the 3D shape. Alternatively, the program performing the adjusting, e.g., CAD program(s) 116), can determine the number of discrete layers, either outside of, or within the topology optimization loop. For example, if the user input indicates six layers, the program may end up with five layers if two layers have the same depth, i.e., the program determines an optimal grouping that results in fewer discrete layers than is specified by the user.

In some implementations, the program can determine the number of discrete layers within a range of numbers of layers provided by the user, e.g., the number of layers (within the range) can be included in the set of variables controlled by the optimizer. In some implementations, the program can determine the optimum number of discrete layers by dividing the layers until each layer includes at least a user-provided number of elements. In some implementations, the program continues to divide the layers until the minimum difference in the gap between two layers is less than a user-provided threshold. Furthermore, in some implementations, one or more planes between discrete layers can be determined by preprocessing of any geometry that is input to the generative design process, such as by identifying one or more planes (which are perpendicular to a milling axis) of any input preserve bodies.

Figure 4A:
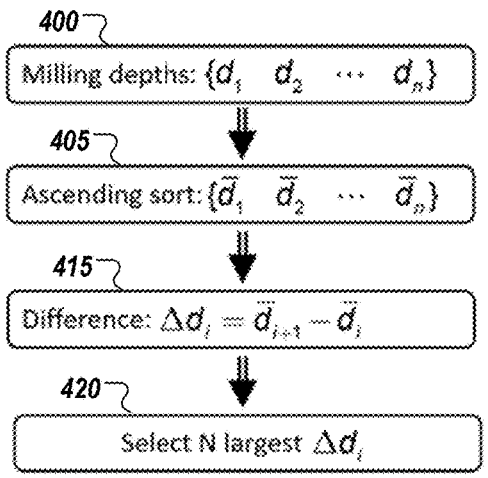
FIG. 4A shows an example of sorting milling depths.
Figure 4B:
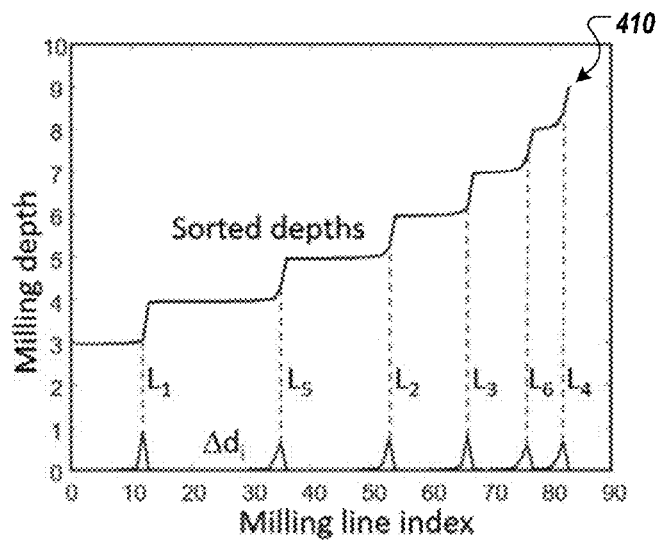
FIG. 4B shows an example of specified layer boundaries for sorted milling depths.

The grouping 220 can include sorting 225 the different milling depths to produce sorted milling depth values. FIG. 4A shows an example of sorting milling depths. As shown, $d_1, d_2, \ldots, d_n$ are milling depths 400 for all milling lines. These milling depths 400 can be sorted 405 into ascending order, which is denoted as $\bar{d}_i$. FIG. 4B shows an example of specified layer boundaries for sorted milling depths 410. Note that FIG. 4B is a hypothetical graph, but it shows the logic of grouping milling lines when their depths are similar. Moreover, other approaches to grouping the milling depths are also possible. For example, in some implementations, a clustering algorithm, such as the support vector machine algorithm, which divides data into a given set of groups, can be used.

Referring again to FIG. 2, in some implementations, the grouping 220 can include identifying 230 the two or more largest differences in the sorted milling depth values, and assigning 235 each of the different subsets of the individual elements to one of the three or more discrete layers based on a position of each subset's milling depth within the sorted milling depth values in relation to the two or more largest differences. For example, the boundaries for the layers can be defined as the points where there are the largest jumps in milling depths. Referring to FIG. 4A, the difference of milling depths, $\Delta d_i = \bar{d}_{i+1} - \bar{d}_i$, can be calculated 415 for all milling lines, e.g., the difference between the current and previous milling depths is calculated and stored.

Among all $\Delta d_i$, the largest NLEVEL milling depth differences (where NLEVEL is user defined or partially or fully automatically determined, as described above) can be selected as the boundaries between the discrete layers. In FIG. 4B, these boundaries are denoted as $L_1, L_2, \ldots, L_6$. If NLEVEL=3, then only $L_1$, $L_2$, and $L_3$ are used for the layer boundaries. Once the layer boundaries are defined, all elements between two boundaries (or on respective sides of the two extreme boundaries) belong to the same level for 2.5-axis machining. For example, the milling depth differences can be sorted, and the largest difference can be used to identify the first boundary, the second largest difference can be used to define the second boundary, etc., until NLEVEL groups of milling depths have been defined. Further, it should be noted that the depths need not be sorted in every iteration during generative design optimization, let alone be sorted frequently. For example, if the maximum change in design variables at one iteration is relatively small, this means the sorting may not be required. Therefore, in some implementations, as the process approaches the optimum design (close to convergence) the milling depths may not need to be sorted in every iteration.

Returning again to FIG. 2, the grouping 220 can include setting 240 the single milling depth in each respective discrete layer of the three or more discrete layers based on milling depths associated with element subsets assigned to the discrete layer, e.g., while preserving the total amount of materials. In some implementations, the single milling depth in each group is defined as the average of all milling depths within the group. Note that topology optimization frequently includes the total amount of material used as an objective or constraint. Therefore, when adjusting a design for 2.5-axis milling, it may be preferable to keep the same total amount material before and after adjustment. Calculating the layer depth by averaging all depths in the group causes the amount of material used to be automatically preserved, thus improving the accuracy of the topology optimization process with respect to adjustment for 2.5-axis milling.

Density values for at least a portion of the individual elements in the density-based representation are changed 245 such that a single milling depth is produced for each of the three or more discrete layers. Note that not all the mesh elements need be changed in all cases, as some elements may be in regions that are excluded from the 2.5-axis machining requirement. Also note that, in addition to potentially having two or more design regions and non-design regions, different design regions can have different 2.5-axis conditions, such as the number of layers and milling direction(s). The changing 245 can involve reassign milling depths of all milling lines within each group (such that all milling lines with a group will have the same milling depth) using the average depth, as follows.

For a given layer L, assume that there are $M_L$ milling lines. Since all milling lines have different milling depths, the average milling depth can be used as a representative milling depth for layer L. Let $d_i$ ($i=1, \ldots, M_L$) be the milling depths for the layer. Then, the average milling depth can be defined as $$d_{ave}^L = \frac{1}{M_L} \sum_{k=1}^{M_L} d_k \qquad (3)$$

Once the average milling depth for layer L is calculated, the topology densities of all elements in all milling lines in the layer can be recalculated using the average milling depth:

$$\hat{p}_i = H_\eta(d_i) = \frac{\tanh(\beta d_{ave}^L) + \tanh(\beta(d_i - d_{ave}^L))}{\tanh(\beta d_{ave}^L) + \tanh(\beta(d_{max} - d_{ave}^L))} \qquad (4)$$

In Equation (4), the parameter $\beta$ can be the same as that in Equation (2), or it can be different. In some implementations, the same value of $\gamma=\eta=3.0$ can be used. Along the milling line, if the element depth location is less than the averaged milling depth, the element has zero density, and has a density of one otherwise. Note that additional approaches to changing the densities to force a shared milling depth in each group, aside from the approach of Equation (4), are also possible, such as using a step function.

In general, any suitable monotonically increasing function between 0 and 1 can be used.

Figure 4C:
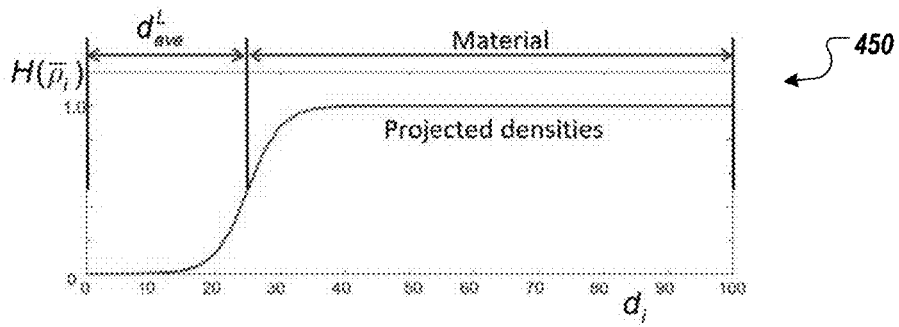
FIG. 4C shows an example of projecting element topology density along a milling line.

FIG. 4C shows an example 450 of projecting element topology density along a milling line. In this example, there are 100 elements along a milling line and the average milling depth is 25. By repeating this projection for all milling lines in the same group, all milling lines will be caused to have the same milling depth; that is, the milling plane is defined as the average milling depth as the height.

The description thus far focuses on optimizing part shape for only one milling direction. But the projected topology density in Equation (4) can be applied to every milling direction. Let NT be the total number of milling directions. Then, the topology density can be determined by:

$$\rho_{i,N} = (\hat{\rho}_i)_1 (\hat{\rho}_i)_2 (\hat{\rho}_i)_3 \ldots (\hat{\rho}_i)_{NT} \quad (5)$$

This density can be stored in an array, while optimization uses $\rho_i$ as the main variables. Thus, the described implementations can be extended to two or more milling directions. The two or more milling directions can be determined by user input or by automatic detection.

Figure 4D:
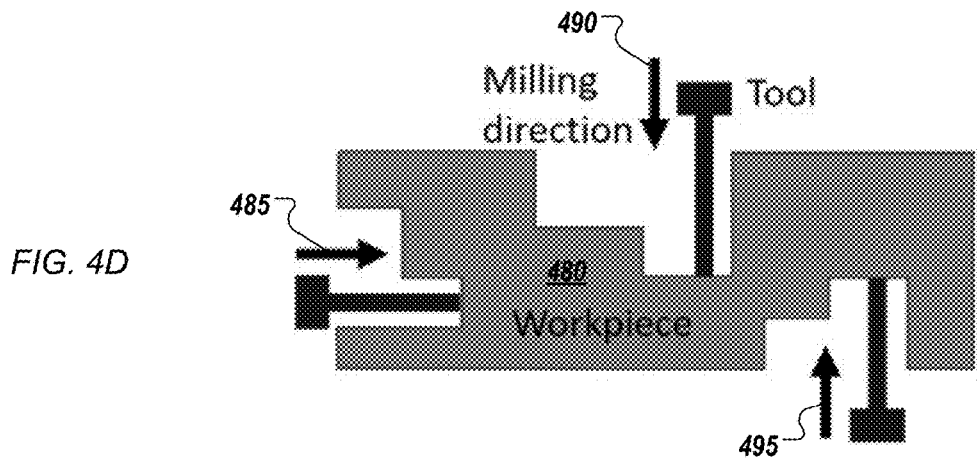
FIG. 4D shows examples of different milling directions in relation to a workpiece.

FIG. 4D shows examples of different milling directions 485, 490, 495 in relation to a workpiece 480. The two or more milling directions can include one or more pairs of parallel (or collinear) milling directions 490, 495 with opposite sign (i.e., the part is machined, flipped over, and machined again). The two or more milling directions can also include non-parallel milling directions 485, 490. However, the approach described in this specification is applicable to many additional, non-parallel (and non-collinear) milling directions beyond what is shown in FIG. 4D. In practice, the number and arrangement of the milling directions may be entirely under user control.

In addition, the size of tool(s) to be used to manufacture the structure can be taken into consideration during the production of the 3D shape of the modeled object. Note that even when the 3D model is composed of flat planes with different heights, this does not mean all of the 2.5-dimension planes can be machined using 2.5-axis milling machine. In order to be practical, it is necessary that the tool can actually access every point on the plane. First, the tool length must be big enough so that the tool can reach the plane with a specific height. Also, since the cross-section of a tool is circular, it cannot cut a concave sharp corner. Therefore, the topology optimum design should consider the tool length and tool size so that the workpiece can be machined appropriately.

Figure 7A:
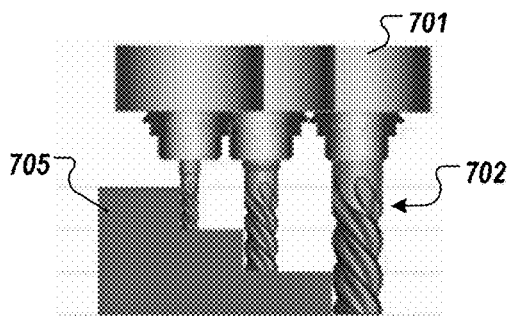
FIG. 7A shows an example of tool length versus tool diameter in 2.5-axis machining.

Thus, a tool-size condition can be applied to modify milling depths for those elements that cannot be machined by the tool(s) during manufacturing, and this modification improves manufacturability of the modeled object. FIG. 7A shows an example of tool length versus tool diameter in 2.5-axis machining. Various tools 702 can be attached to a spindle 701 of a subtractive manufacturing machine. As shown in FIG. 7A, if the length of the tool 702 is presumed to be greater than the needed depth of cut, there is no need to consider interference between the head of the spindle 701 and the object (workpiece) 705 to be cut into the part being manufactured. Thus only the interference with the tool 702 needs to be considered.

If the user (or another process) provides the maximum length of the tool 702, then during the topology optimization, the machining depth is limited by this maximum tool length. In some implementations, during topology optimization with the 2.5-axis condition, the milling depth at every layer can be calculated using Equation (3). Letting a minimum tool length (provided by the user or another process) be $L_{min}$, then, the average milling depth in Equation (3) can be adjusted as $$\text{If } d_{ave}^L > L_{min}, \text{ then } d_{ave}^L = L_{min} \quad (6)$$

However, because it is preferred to not use a small diameter tool to cut a deep plane, e.g., due to chatter vibration, the tool size constraint can be limited to the case where the tool diameter depends on the tool length. Thus, in some implementations, the relationship between the tool 702 length and the tool 702 diameter is:

$$\text{Tool diameter}(d_{tool}) = \frac{\text{Required depth}}{2} = \frac{\text{Part top} - \text{layer bottom}}{2} \quad (7)$$

In general, the length of the tool 702 to be used to manufacture a given layer of a designed part will be long enough for the tool 702 to cut to the bottom of the layer without any interference from the head of the spindle 701, i.e., greater than the difference between the bottom of the given layer and the top of the top most layer, and the diameter (or radius) of the tool 702 to be used to manufacture the given layer of the designed part will be a predefined fraction (e.g., ½) of the difference between the bottom of the given layer and the top of the top most layer.

Figure 7B:
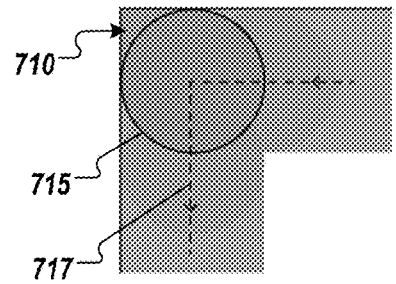
FIG. 7B shows an example of a corner region that cannot be machined with a tool of a given size.

Nonetheless, there can still be elements of a modeled object that are not reachable by the different sized tools 702. FIG. 7B shows an example of a corner region 710 that cannot be machined with a tool 715 of a given size. The main issue related to the tool size is that the circular tool 715 cannot cut a corner 710 as shown in FIG. 7B. In FIG. 7B, the circle is the cross-section of the tool 715 from the top view. The tool 715 is expected to cut an L-shape as it follows a toolpath 717. The corner region 710 cannot be machined using the tool 715 and should be moved up to an upper layer; note that the size of the region 710 depends on the diameter of the tool 715. Therefore, a key issue of tool-size condition application is how to identify the corner regions and move those elements in the corner region to the upper level.

Figure 7C:
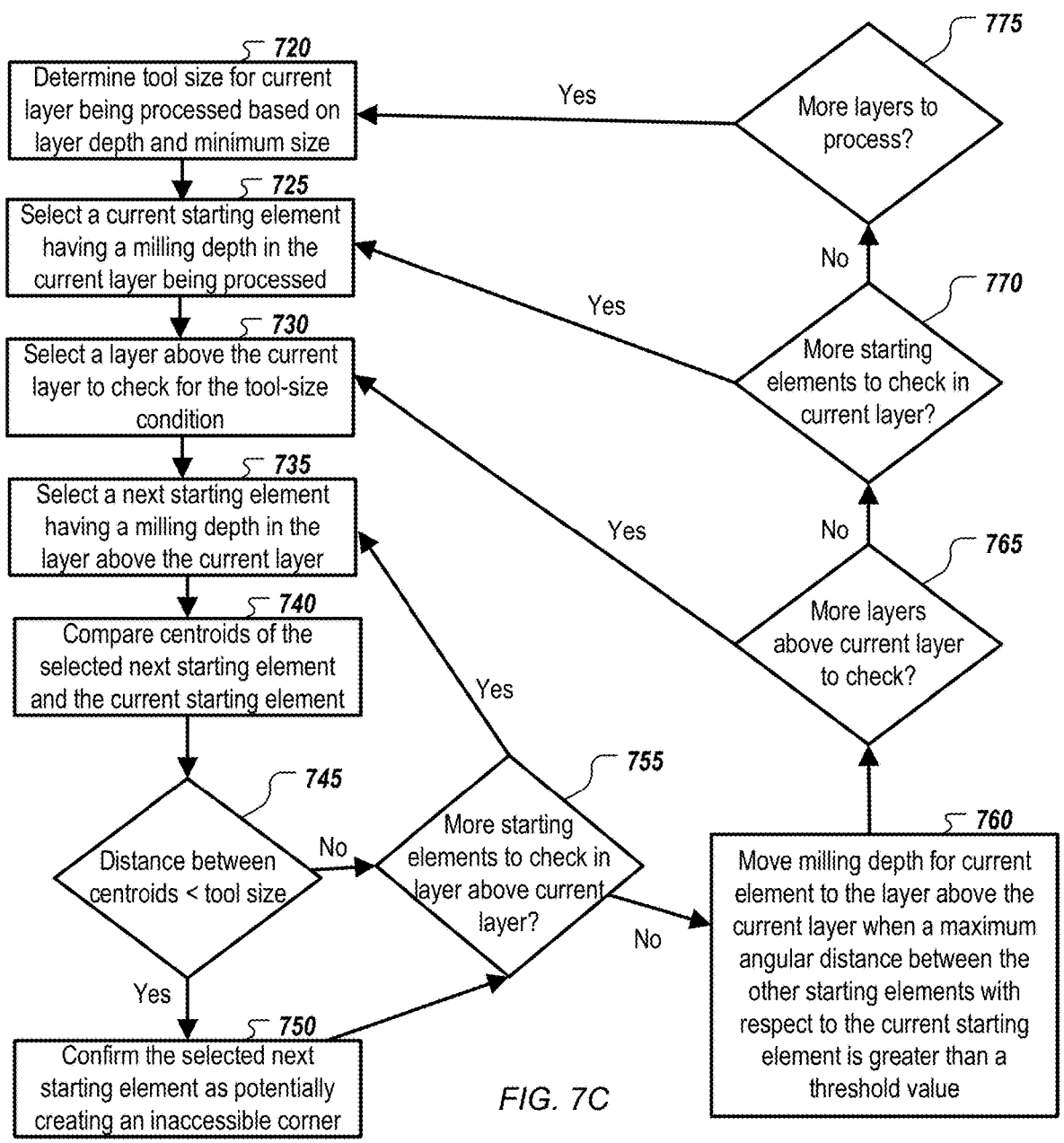
FIG. 7C shows an example of a process of identifying a corner region.

FIG. 7C shows an example of a process of identifying a corner region. For a current layer being processed, e.g., starting with the bottom layer in the 3D model of object 705 in FIG. 7A, a tool size for the current layer is determined 720 based on the layer depth and a minimum available tool size. In some implementations, a minimum tool diameter $d_{min}$ is provided by a user, e.g., in an input file, and/or by another process. This minimum tool diameter can be a minimum for all available tools, or a minimum for those tools that can be used to machine the current layer. Further, a default tool diameter $d_{tool}$ can be calculated, such as by using Equation (7) above, and the tool diameter to be used can be determined 720 to be the maximum of ($d_{min}$, $d_{tool}$).

A current starting element is selected 725, where the starting element has a milling depth in the current layer being processed. In some implementations, the starting elements and milling depths are determined using process steps 200-245 described above in connection with FIG. 2. In some implementations, the starting elements and milling depths are determined separately from a process that generates an initial 2.5-axis compatible design. In some implementations, the starting elements and milling depths are determined using a process described below in connection with FIG. 9B. In any case, each starting element identified for the density-based representation has a milling depth specified for the starting element, e.g., an index value in an array of values for the starting elements, where each index value specifies one of the three or more discrete layers along the milling direction for the starting element, and so the starting elements for milling lines with a milling depth in the current layer are readily identified.

For a current starting element, other starting elements that meet specific criteria in relation to the current starting element are identified. To do this, a layer above the current layer is selected 730 to check for the tool-size condition. For example, if the current layer is discrete layer 3, then the initial layer above the current layer to check is discrete layer 2. A starting element to check is selected 735, where the element subset for this selected starting element has a milling depth associated with the layer above the current layer. As with selecting the current starting element, starting elements for milling lines with a milling depth in the layer above the current layer are readily identified, regardless of how the starting element and milling depth data are determined. Thus, for example, a next starting element having its milling depth in discrete layer 2 is selected 735.

The centroid of the selected starting element (e.g., with its milling depth in layer 2) is compared 740 with the centroid of the current starting element (e.g., with its milling depth in layer 3). A check 745 of the distance between these centroids determines whether or not the starting element being checked should be included in a list of other starting elements that may make the starting element in the current layer unreachable during machining of the part. Note that this distance is measured in a projection plane perpendicular to the milling direction, e.g., distance measured in x-y dimensions; in other words, the distance being checked is the distance between milling lines. If the distance between the centroids is less than the tool radius to be used (as determined 720) then the selected next starting element is confirmed 750 as one of the other starting elements that may create an inaccessible corner. If the distance between the centroids is less than the tool radius to be used (as determined 720) then the selected next starting element is not one of the other starting elements that may create an inaccessible corner.

This process of selecting 735, comparing 740, and confirming 750 repeats until each of the starting elements having a milling depth associated with the layer above the current layer have been checked 755. Thus, the process operations 735-755 represent an example of identifying 190A from FIG. 1B. Further, when a maximum angular distance between the other starting elements (which have been confirmed 750) with respect to the current starting element is greater than a threshold value, the milling depth for the current starting element is moved 760 to the layer above the current layer. This can involve changing density values for at least a portion of the individual elements in the density-based representation corresponding to the starting element, such as using Equation (4) to reassign the milling depth for the current starting element to the higher layer.

In addition, a check for more layers above the current layer can be done 765, and while such layers are available, the process can repeat by selecting 730 the next layer above the current layer and making additional upward moves 760 of the milling depth, as needed. Likewise, while more starting elements in the current layer remain to be checked 770, the process of FIG. 7C repeats by selecting 725 a next current starting element in the current layer, and while more layers remain to be processed 775, the process of FIG. 7C repeats by determining 720 the tool size for the next current layer. Thus, process operation 760 corresponds to the calculating 190B and moving 190C from FIG. 1B, and the process operations 730-755 and 765-775 correspond to identifying 190A from FIG. 1B.

FIG. 8A shows an example of a starting element array 800 for a 3D model 805 designed for manufacturing using a 2.5-axis manufacturing process. In this example, the tool-size control is implemented using the array 800 of starting elements, which includes the layer information of each milling line. For a given milling direction 802, each starting element is a first element in the density-based representation that the tool meets when approaching the 3D model 805. In this example, the 3D model 805 has three layers: Layer 1 has the shortest depth, Layer 2 has a longer depth, and Layer 3 has the longest depth. In some implementations, for the convenience of calculation, coordinate transformation is performed for all starting elements such that they are in the x-y plane with the milling direction 802 in the negative z-coordinate direction. But such a coordinate transformation is not required in all implementations.

The rectangular grid 800 is the array of starting elements, which have associated information indicating the milling depths for the milling lines of the starting elements. In this example, the starting element array 800 includes this information as layer index values, which indicate the layer that the milling line of the starting element belongs to, and so the milling depth increases with the layer index. As shown in FIG. 8A, the starting elements with index=1 belong to Layer 1, the starting elements with index=2 belong to Layer 2, and the starting element with index=3 belong to Layer 3. In some implementations, these layer index values are available as output from the grouping 220 described in connection with FIG. 2. In some implementations, these layer index values are calculated separately from the determination of layer boundaries for 2.5-axis milling.

Since milling Layer 1 is the top layer, it will not be affected by any other layers (during manufacturing from this milling direction). Therefore, the tool size for the first layer need not be checked. Milling Layer 2 will be affected by Layer 1, but not by Layer 3 because the latter is deeper than Layer 2 (no element in Layer 3 can prevent the tool from reaching an element in Layer 2 when the tool approaches the workpiece along the milling direction 802). Therefore, the tool-size control of layer 'K' only needs to be checked against layers from 1 to 'K−1'. The basic idea of the tool-size check is that if there is any element (the element at the milling depth in a milling line) that cannot be reached by the tool, the assigned layer of the element is moved up so that it can be accessed in the above layer. Note that this also makes the approach conservative in the sense that more material will be added as a result of imposing the tool-size check. In some implementations, optimization is already converged with the 3-axis milling condition, and so the tool-size condition is not designed to provide a completely new optimum design. Rather, the tool-size condition is a local fix to make it possible to machine a workpiece (in accordance with the 3D model 805) with a given tool size.

Even so, in some implementations, the total amount of material can be preserved by adjusting the shared milling depths in each of the three or more discrete layers in which a change was made by the tool-size check, thus maintaining the total amount of material used as an objective or constraint during topology optimization. For example, the amount of material added by adjusting milling depths due to the tool-size check can be calculated, the number of milling lines belonging to the current layer can be calculated, and then the average depth of the current layer can be adjusted by the total added material divided by the total number of milling lines in the current layer.

FIGS. 8B-8D show examples of tool intersection for different elements, which illustrates the strategy of how to detect if an element can be cut or not. A circle 810 represents the cross-section of the tool. The tool diameter covers 8 elements, as shown in FIG. 8B. For a given element E1 that belongs to Layer 2, elements within the tool radius (i.e., in a projection plane perpendicular to the milling direction 802) are searched to find those elements that belong to upper layers (in this case only Layer 1). By measuring angles between E1 and all elements in the upper layer whose distance is less than the tool radius, the maximum and minimum angles between E1 and the elements in the upper layer(s) can be identified.

The range of angle Δθ can be calculated as the difference between the maximum and minimum angles. In the case of E1 in FIG. 8B, the range of angle Δ® is 113°. In contrast, in the case of E2 in FIG. 8C, the range of angle Δθ is 233°. It is clear that E1 can be cut (E1 in Layer 2 can be reached, without interference from elements in Layer 1, by moving the tool down, in the −y direction), but E2 cannot (moving the tool to avoid interference from elements in Layer 1 prevents any part of the tool from reaching E2 in Layer 2). By applying the same idea for different elements, FIG. 8D shows that elements 815 cannot be cut in this example. Their ranges of angle are 195°~233°. In general, when the range of angle is greater than 195°, the corresponding element cannot be cut with the current tool. Note that other angle thresholds are possible in different implementations. The 195° threshold is for square shaped elements, and elements having different shapes (e.g., rectangular) may need a different angle threshold. In any case, when the threshold angle is exceeded, the layer of the current element should be moved to the upper layer. Therefore, the process of fixing the corner element can include: if Δθ>195° for a starting element's current milling depth, move the milling depth to the upper level for this starting element, otherwise keep the milling depth in the current level.

However, in order to find the range of angle Δθ, it is necessary to calculate the maximum and minimum angles, such that:

$$\Delta\theta = \theta_{max} - \theta_{min} \quad (8)$$

Determining the maximum and minimum angles can be challenging as the corner can be located in an arbitrary direction, and the mathematical function of calculating angle, e.g., ATAN or ATAN 2, can have both negative and positive values. In order to calculate the maximum and minimum angles correctly, the angles can be measured in such a way that all upper level elements cluster together. For example, letting e be the index of the current element in the current layer, and letting N be the number of elements in the upper layer(s) whose distance to the element e is less than the tool radius, let $x_j$ be the location of upper layer element j, and $v_{ej} = x_j - x_e$ is the relative position vector of element j with respect to the current element e.

FIG. 8E shows an example of this in which arrows 820 represent the vectors, $v_{ej}$, between E2 and each element j that is both within the radius of the tool 810 and has a milling depth in the higher layer (in Layer 1 in this example). Then, the center of gravity of these relative vectors can be calculated by:

$$v_{CG} = \frac{1}{N}\sum_{j=1}^{N} v_{ej} \quad (9)$$

The center of gravity $v_{CG}$ is in the direction toward the center of elements in the upper layer. Therefore, in angle calculation, the negative direction, $-v_{CG}$ 825, can be used to measure the angles. By doing this, all angles with the upper layer elements cluster together and the maximum and minimum angles can be calculated correctly.

The process described above can be used to remove non-manufacturable corners from the 3D model of the generatively designed object, but even after the removal of such corners, non-manufacturable cave-ins can still be present in the 3D model of the generatively designed object. FIG. 8F shows an example of a cave-in element 850, which cannot be machined, being identified. As shown in FIG. 8F, the range of angle with respect to $-v_{CG}$ 855 is 180 degrees, which is less than the threshold of 195 degrees. And yet, the element cannot be machined because the distance between two upper-layer elements on either side of element 850 is too narrow for the tool. Therefore, after all corner elements are fixed, the cave-in elements, e.g., as shown in FIG. 8F, can also be fixed by moving them to the upper layer. The cave-in elements can be identified by using the adjacent elements in measuring angles, as described in further detail below in connection with FIG. 9D.

In addition, as many generatively designed 3D models will have multiple layers, it is possible that the tool in one layer may have an interference with multiple upper layers. In such a case, if the tool cannot machine a particular element, it is unclear which layer the element should be moved up to. In order to resolve this issue, the search for interference can be performed in the reverse order. For example, if the current layer is ILAYER, the interference check can be first performed with ILAYER-1 layer. If an interference is detected, then the milling depth for this starting element is moved up to ILAYER-1, and the process stops for this current element. If not, two upper layers, ILAYER-1 and ILAYER-2, are used for the interference check. If an interference is detected, then the milling depth for this starting element is moved up to ILAYER-2, and the process stops for this current element. This process is repeated until the top layer is reached. If the element does not have any interference with all elements in the upper layers, then the milling depth for this starting element remains in the current layer. Thus, returning to FIG. 2, the corner removal process (which involves identifying other starting elements, e.g., identifying 190A, calculating a maximum angular distance between the other starting elements, e.g., calculating 190B, and moving the milling depth, e.g., moving 190C) can be performed 250 sequentially for layers above the current layer beginning with a layer immediately above the current layer.

But for the cave-in element detection, an opposite process can be used. For example, if the current layer is ILAYER, the interference check can be first performed with the first (topmost) layer. If an interference is detected, then the milling depth for this starting element is moved up to the first layer, and the process stops for this current element. If not, the first two layers, Layer 1 and Layer 2, are used for the interference check. If an interference is detected, then the milling depth for this starting element is moved up to Layer 2, and the process stops for this current element. This process is repeated until the ILAYER-1 layer. If the element does not have any interference with all elements in the upper layers, then the element remains in the current layer. Thus, the cave-in removal process (which involves identifying other starting elements, calculating a maximum angular distance between the other starting elements, and moving the milling depth) can be performed 255 sequentially for layers above the current layer beginning with the top most layer.

Moreover, in some implementations, no particular sequence of elements in the density-based representation is assumed. Because of this, the outcome of applying the tool-size condition might be different for the same mesh with different element sequences. In order to prevent an element-sequence dependent outcome, the corner removal process 250 and/or the cave-in removal process 255 can be repeated until there is no further change 260, i.e., the processes 250, 255 iterate while any milling depths have been moved in the last iteration. In this way, the final design is independent of specific element sequences.

In some cases only one milling direction is used, e.g., during the process of FIG. 2, but in other cases more than one milling direction is used, and the corner removal and the cave-in removal processes (and potentially also the adjusting of the densities) are performed separately for each of the two or more milling directions to produce respective milling-direction-specific data sets. Therefore, in some implementations, a check 265 is performed to see if additional milling directions are still to be processed. If so, the process switches 270 to the new orientation for the next milling direction before potentially proceeding with the collecting 200, grouping 220, and changing 250, and before proceeding with corner removal 250 and cave-in removal 255. In some implementations, the switching 270 involves performing a coordinate transform such that the cutting planes are parallel to the x-y plane and the milling direction is in the negative z-coordinate. But as noted above, a mapping between the physical domain of the density-based representation (used in topology optimization) and a virtual domain (for doing the milling direction processing) is not required, which can result in a faster and more accurate process. In some implementations, the switching 270 need not involve any coordinate transformation for different milling directions, as the switching 270 can involve switching to a new data structure (or a new portion of a common data structure) in which to store starting elements and sequences of elements along each milling line for the different milling direction.

Once all the different milling directions have been processed, the respective milling-direction-specific data sets can be combined 280 to update the density-based representation of the generatively designed three dimensional shape of the modeled object. The combining 280 can involve multiplying the densities together. Nonetheless, regardless of whether or not multiple milling directions are used, the resulting design of the part/object is composed of (entirely or mostly) multiple flat planes with different heights and no undercuts. Note that the final design need not be composed entirely of such flat planes, such as when input preserve bodies with curved surfaces are used, or when the topology optimization process also takes into account the shape of the machine tool, which may be a ball nosed cutter.

Figure 9A:
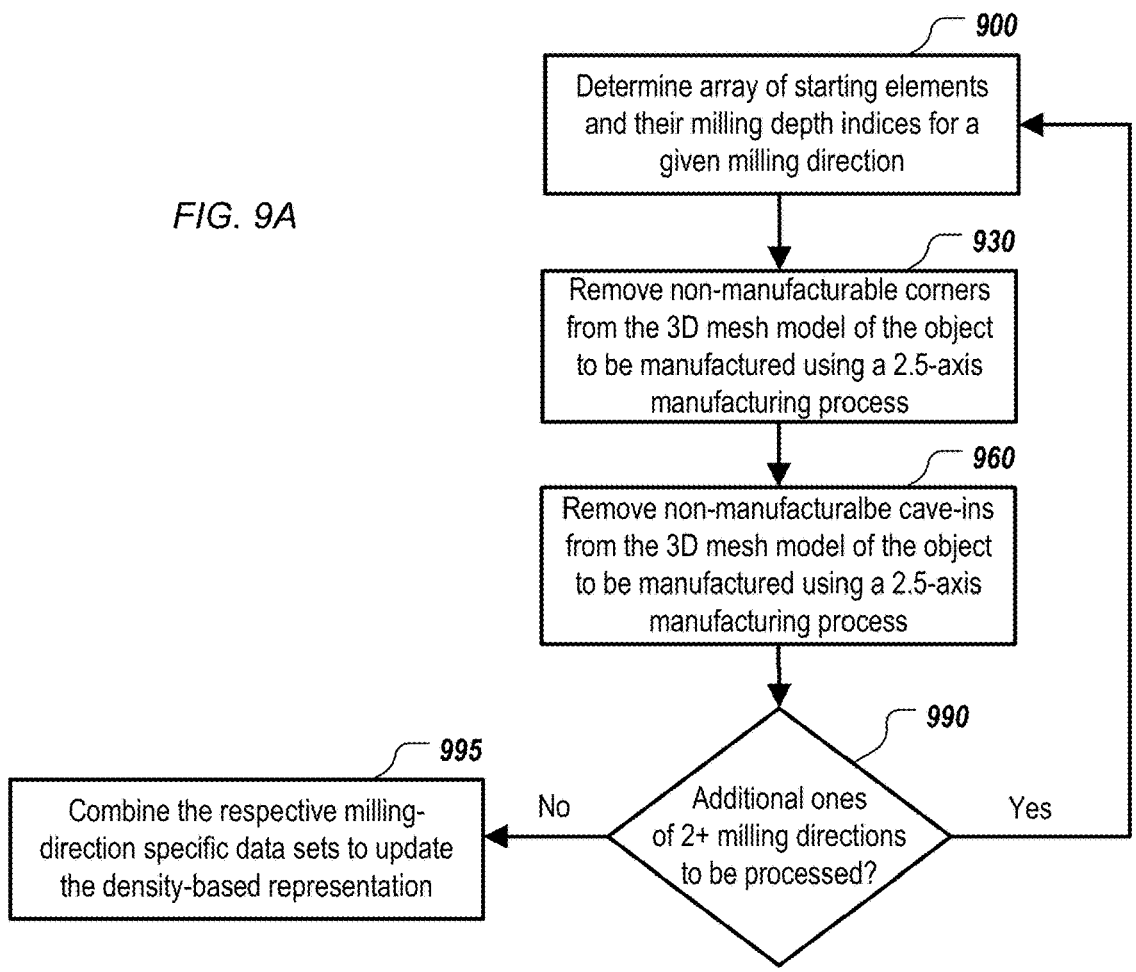
FIGS. 9A-9E show an example of processes of removing non-manufacturable corners and cave-ins in a 3D model designed for manufacturing using a 2.5-axis manufacturing process.

In addition, as noted above, in some implementations, the starting elements and milling depths are determined separately from a process that generates an initial 2.5-axis compatible design. Thus, in some implementations, process steps 200-245 are not used, even when process steps 265-280 are used. FIG. 9A shows an example of a process of removing non-manufacturable corners and cave-ins in a 3D model designed for manufacturing using a 2.5-axis manufacturing process. In this example, an array of starting elements and their milling depth indices are determined 900 for a given milling direction, but other data structures can be used to keep track of starting elements and milling depths for the discrete layers. In any case, the determining 900 can be performed during the process that generates a 2.5-axis compatible design (e.g., during process steps 200-245 in FIG. 2) or in a process that operates on a 2.5-axis compatible design produced by a separate generative design process.

As noted above, some implementations will operate on meshes composed of tetrahedral elements and/or an unstructured mesh. In some implementations, the density-based representation of the modeled object is a non-regular mesh in which the ordering of elements in the mesh doesn't conform to a regularized ordering (e.g., a voxelized mesh with elements randomly ordered). The implementation of the tool-size condition involves considering the geometric relationship between elements in the plane perpendicular to the milling direction. When the mesh is generated using a Cartesian grid and when elements are ordered in each coordinate direction, it is much easier to identify the geometric relationship between elements. However, this can limit the applicability of the described systems and techniques, e.g., during topology optimization with 2.5-axis milling. For example, it is possible that the initial domain is not a box shape. This often happens when the user has a preexisting shape and wants to reduce the material further using topology optimization. Also, when there is symmetry and/or non-design region(s), it is difficult to have a box-shaped domain with regularly ordered elements. Thus, in some implementations, the initial domain is given in the form of a voxelized mesh, and the elements may be randomly ordered.

Figure 9E:
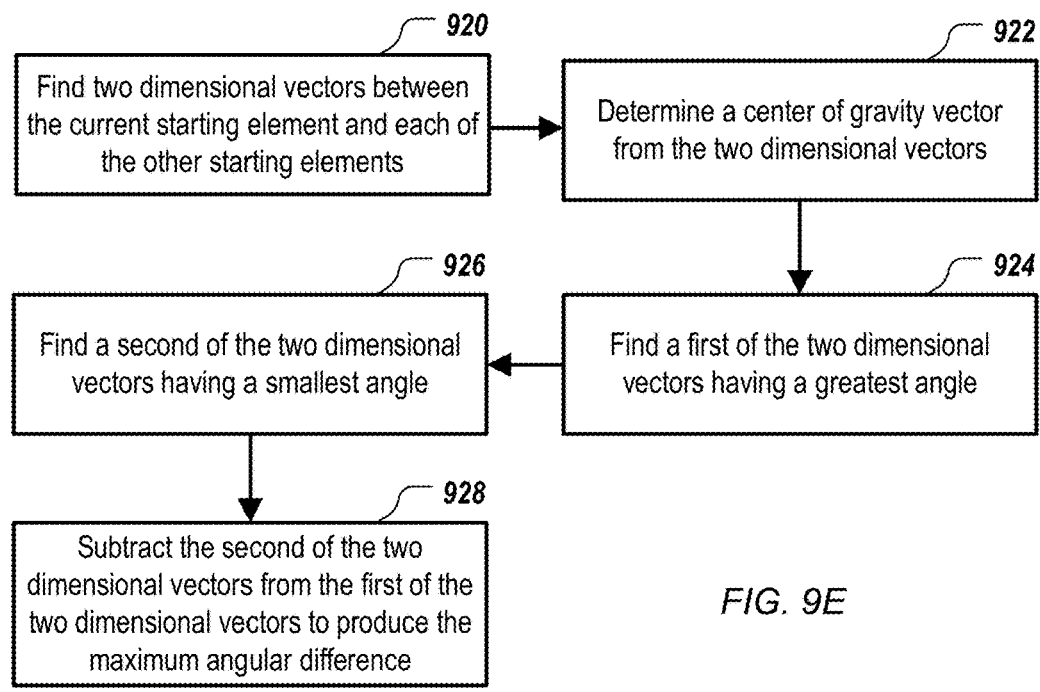
Figure 9B:
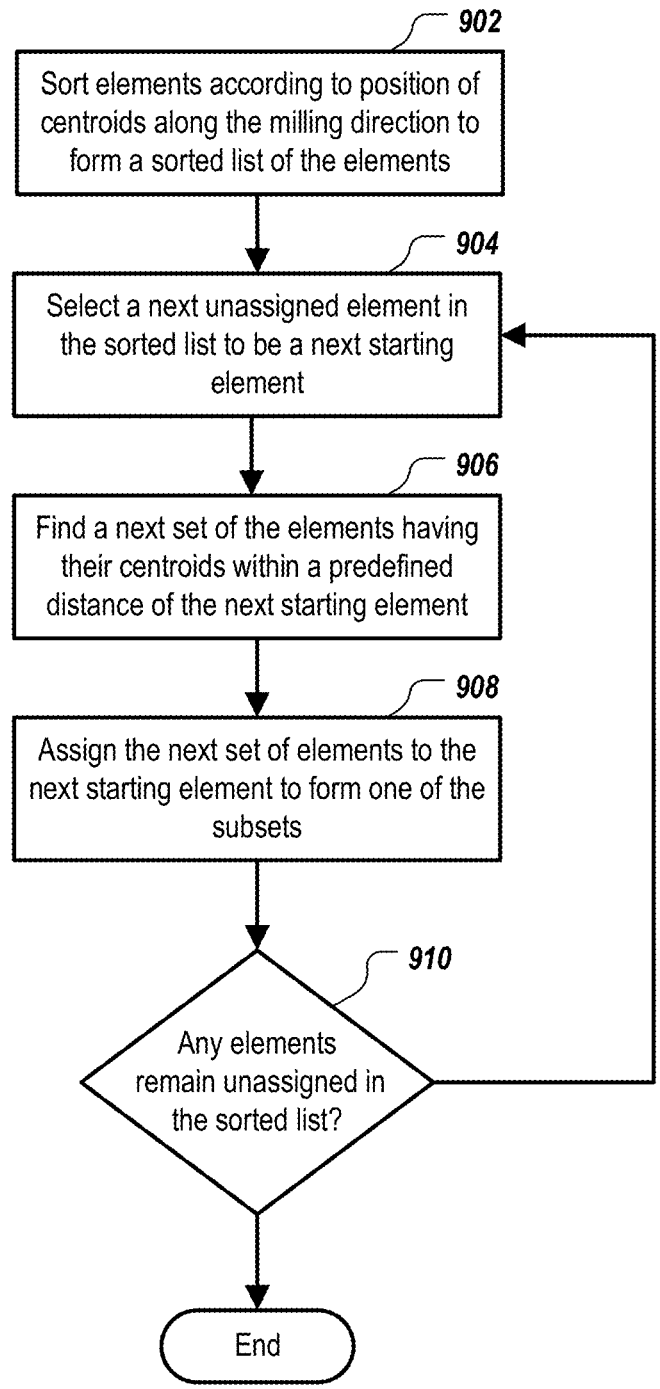

FIG. 9B shows an example of a process for obtaining the data specifying a starting element for each of multiple different subsets of elements in the density-based representation of the modeled object (e.g., determining 900 the array of starting elements and their milling depth indices) for a non-regular mesh in which the ordering of elements in the mesh doesn't conform to a regularized ordering. The elements in the density-based mesh representation are sorted 902 according to positions of centroids of the elements along an axis of the milling direction to form a sorted list of the elements. This can be done, for example, after transforming all element centroids into the coordinate system of the milling direction. Note that by changing coordinates such that the milling direction is parallel with the z-coordinate dimension, e.g., as part of switching 270, it is possible for the array of starting elements to reside in the xy-plane as shown in FIG. 8A. In any case, after the sorting 902, the starting elements will be toward the beginning of this sorted list, e.g., the elements with smaller z values.

A next unassigned element in the sorted list (i.e., the next element having the smallest value along the axis of the milling direction) is selected 904 to be a next starting element. A next set of the elements in the density-based mesh representation having their centroids within a predefined distance from the centroid of the next starting element are found 906. Note that this distance measurement is the same as that discussed above in connection with FIG. 7C in that the distance is measured in a projection plane perpendicular to the milling direction, e.g., distance measured in the x-y dimensions. Also, the predefined distance can be the tolerance value noted above in connection with FIG. 3A, which can have a default value based on a parameter of the program and can be user changeable. For example, the default value can be 0.01 times the average element reference dimension, which can be computed using the cube root of the individual element volume. If an element centroid (geometric center) is within this tolerance, then the element is considered to be on the milling line.

In addition, in some implementations, a check can also be made for elements previously assigned to a previous starting element to see if they are closer to this next starting element than the starting element they were previously assigned to. If so, any such elements are reassigned from the previous starting element to this next starting element. The found next set of elements are assigned 908 to the next starting element to form one of the multiple different subsets of elements in the density-based representation of the modeled object (e.g., to form a milling line). Then, the selecting 904, the finding 906, and the assigning 908 are repeated until no elements in the sorted list remain unassigned 910.

Further, although the systems and techniques can be efficiently used with various types of voxelized meshes, e.g., a hexahedral (hex) mesh, which may be regular or non-regular, the systems and techniques described in this document need not be used with a voxelized mesh. In some implementations, other types of meshes and elements, such as tetrahedral (tet) elements, are handled. However, while tet meshes work well with topology optimization with additive manufacturing constraints, for milling, it is desirable to use voxelized meshes because the elements line up nicely, so one gets shapes that make sense; they do not tend to undulate.

In addition, while there is a potentially infinite number of milling directions one could explore, e.g., for tet elements, the present inventors have determined that one only needs 26 different directions to improve the design for 2.5-axis milling processes performed using a CNC machine that can perform 5-axis milling. Specifically, the number of milling directions can be limited to 26 different directions which are used in the most general 5-axis milling: 8 corners, 12 edges, and 6 faces. Fewer milling directions can be used for 2.5-axis or 3-axis machines. For example, in some implementations, 26 different directions are supported for 5-axis machines, 21 different directions are supported for 3-axis machines, and 9 different directions are supported for 2.5-axis machines. Moreover, in some implementations, the user is free to do something else because the user can define a coordinate system to use.

Returning to FIG. 9A, non-manufacturable corners are removed 930 from the 3D mesh model of the object to be manufactured using a 2.5-axis manufacturing process. This can involve using the operations described above in connection with FIGS. 1B, 2 and 7A-8E and/or using the operations described blow in connection with FIG. 9C. Also, non-manufacturable cave-ins are removed 960 from the 3D mesh model of the object to be manufactured using the 2.5-axis manufacturing process. This can involve using the operations described above in connection with FIGS. 1B, 2, 8E and 8F and/or using the operations described blow in connection with FIG. 9D.

Moreover, in some implementations, while additional ones of two or more milling directions are still to be processed 990, the process of FIG. 9A repeats for a next milling direction. Once all the different milling directions have been processed, the respective milling-direction-specific data sets can be combined 995 to update the density-based representation of the generatively designed three dimensional shape of the modeled object. The combining 995 can involve multiplying the densities together. Also, in some implementations, separate milling-direction-specific data sets are not maintained; for example, the corner removal 930 and cave-in removal 960 processes can operate directly on a single 3D mesh model of the object.

Figure 9C:
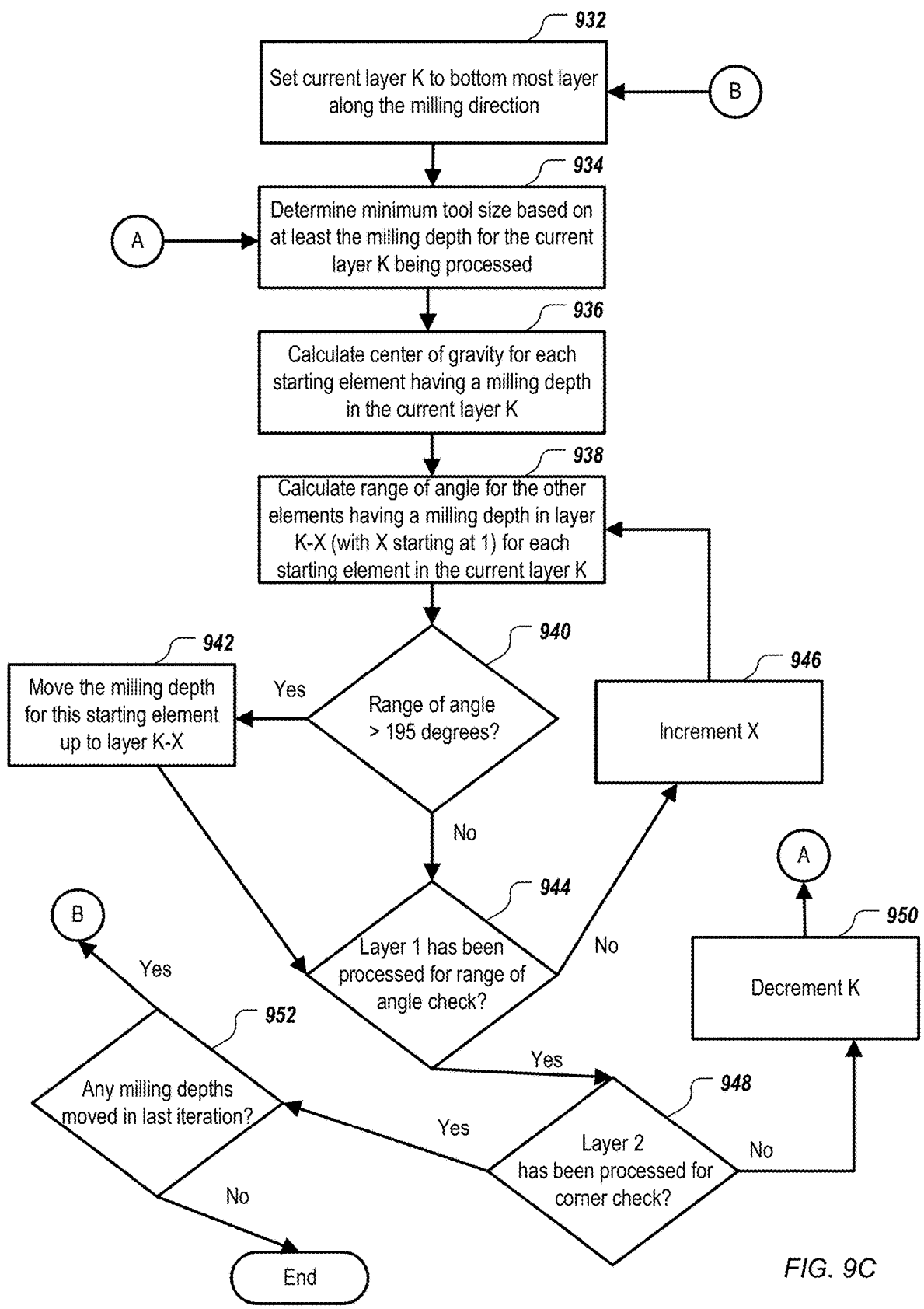

FIG. 9C shows an example of a process of removing non-manufacturable corners. The process begins by setting 932 the current layer K to be the bottom most layer along the milling direction being considered, e.g., Layer 3 in 3D model 805. A minimum tool size is determined 934 based on at least the milling depth for the current layer K being processed, e.g., using Equation (7) to set the minimum tool radius for the current layer.

The center of gravity is calculated 936 for each starting element having a milling depth in the current layer K, e.g., using Equation (9). Note that the calculating 936 can use all the other starting elements identified in any upper layer, e.g., the two dimensional (2D) vectors are between the current starting element in the current layer and each one of all starting elements with milling depths associated with any layer above the current layer and with the distance being less than the tool radius (in the projection plane perpendicular to the milling line).

For each starting element in the current layer K, a range of angle is calculated 938, e.g., using Equation (8), for the other elements having a milling depth in layer K−X. Note that X starts with a value of 1, so the first check of the starting elements having milling depths in the current layer K is done against the other starting elements having milling depths in layer K−1. In addition, the other starting elements must be within the distance, i.e., less than the tool radius, in the projection plane perpendicular to the milling line.

For each starting element in the current layer K, if the range of angle is found 940 to be greater than 195 degrees, the milling depth for this starting element is moved 942 up to layer K−X. Once all the starting elements have been checked with respect to layer K−X, the process continues 944 until layer 1 has been processed for the range of angle check. If the process has not completed 944 the layer 1 check, X is incremented 946, and the process continues. Note that operations 936-946 in FIG. 9C are an example of operations 190A-190C in FIG. 1B.

Further, once the process completes the layer 1 check, i.e., when X=K−1, the process of FIG. 9C confirms 948 that all the layers except the top most layer (layer 1) have had their corresponding starting elements checked, i.e., all layers through layer 2 have been processed to check for non-manufacturable corners. If layer 2 has not yet been processed 948, current layer K is decremented 950, and the process continues to check starting elements having a milling depth in the next higher layer of the 3D model. In addition, a final check 952 can confirm whether or not any milling depths were moved in the last iteration of the process. If so, the process can be repeated from the beginning, as the changes made later in the process can impact the checks done earlier in the process. Thus, the full process of FIG. 9C can be repeated until no milling depth changes are still being made.

Figure 9D:
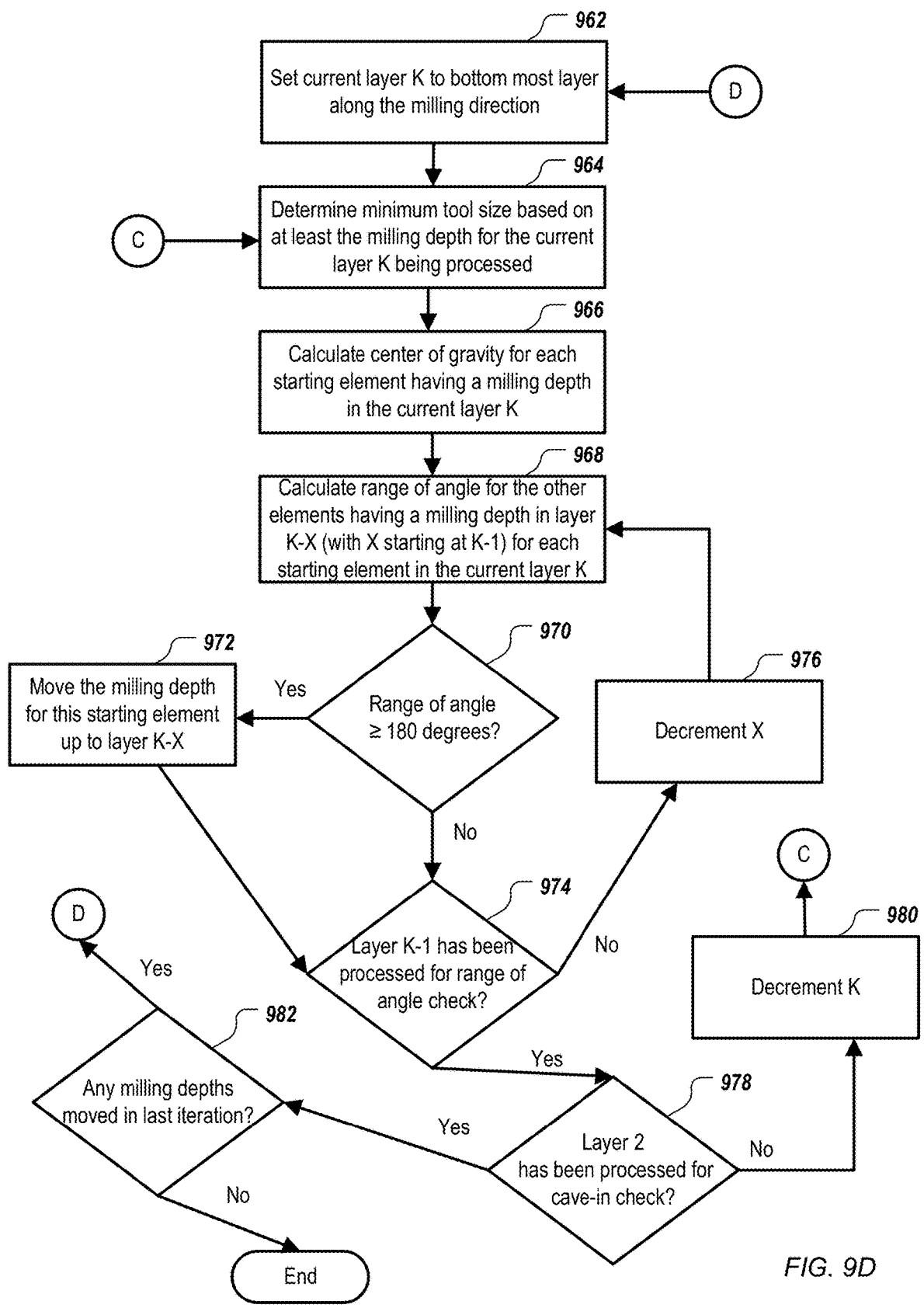

FIG. 9D shows an example of a process of removing non-manufacturable cave-ins. The process begins by setting 962 the current layer K to be the bottom most layer along the milling direction being considered, e.g., Layer 3 in 3D model 805. A minimum tool size is determined 964 based on at least the milling depth for the current layer K being processed, e.g., using Equation (7) to set the minimum tool radius for the current layer.

The center of gravity is calculated 966 for each starting element having a milling depth in the current layer K, e.g., using Equation (9). Note that the calculating 966 can use all the other starting elements identified in any upper layer, e.g., the 2D vectors are between the current starting element in the current layer and each one of all starting elements with milling depths associated with any layer above the current layer and with the distance being less than the tool radius. Note that using this definition allows operation 966 and operation 936 to be the same, but in other implementations, the 2D vectors are between the current starting element in the current layer and each one of all starting elements with milling depths associated with any layer above the current layer that are adjacent to the current starting element in the current layer (i.e., the other starting elements having milling lines immediately adjacent to the milling line of the current starting element).

For each starting element in the current layer K, a range of angle is calculated 968, e.g., using Equation (8), for the other elements having a milling depth in layer K−X. Note that (unlike the corner removal process of FIG. 9C) X starts with a value of K−1, so the first check of the starting elements having milling depths in the current layer K is done against the other starting elements having milling depths in layer 1. In addition, the other starting elements are limited to those that are adjacent to the current starting element in the current layer (i.e., the other starting elements having milling lines immediately adjacent to the milling line of the current starting element).

For each starting element in the current layer K, if the range of angle is found 970 to be greater than or equal to 180 degrees, the milling depth for this starting element is moved 972 up to layer K−X. Once all the starting elements have been checked with respect to layer K−X, the process continues 974 until layer K−1 has been processed for the range of angle check. If the process has not completed the layer K−1 check 974, X is decremented 976, and the process continues. Note that operations 966-976 in FIG. 9D are an example of operations similar to operations 190A-190C in FIG. 1B. Thus, these operations can be understood as involving: identifying 968 additional starting elements that (i) have additional element subsets having milling depths associated with a layer above the current layer and (ii) are adjacent to the current starting element; calculating 966, 968 a maximum angular difference between the additional starting elements with respect to the current starting element; and moving 972 the milling depth for the additional element subset of the additional current starting element to a layer above the additional current layer by at least changing density values for at least a portion of additional individual elements in the additional element subset, in response to the maximum angular difference being 970 greater than or equal to a threshold value.

Further, once the process completes the layer K−1 check, i.e., when X=1, the process of FIG. 9D confirms 978 that all the layers except the top most layer (layer 1) have had their corresponding starting elements checked, i.e., all layers through layer 2 have been processed to check for non-manufacturable cave-ins. If layer 2 has not yet been processed 978, current layer K is decremented 980, and the process continues to check starting elements having a milling depth in the next higher layer of the 3D model. In addition, a final check 982 can confirm whether or not any milling depths were moved in the last iteration of the process. If so, the process can be repeated from the beginning, as the changes made later in the process can impact the checks done earlier in the process. Thus, the full process of FIG. 9D can be repeated until no milling depth changes are still being made.

As noted above, operations 936 and 966 can be the same, and so calculating the maximum angular difference (for both angle calculation 938 and angle calculation 968) can include using this shared operation 936, 966. FIG. 9E shows an example of a process of calculating a maximum angular difference between starting elements in upper layers with respect to a current starting element in a current layer. The 2D vectors between the current starting element in the current layer and each of the other starting elements (within the radius distance) with milling depths associated with one or more layers above the current layer are found 920. In some implementations, this involves finding 920 2D vectors between the current starting element in the current layer and each one of all starting elements (within the radius distance) with milling depths associated with any layer above the current layer.

A center of gravity vector is determined 922 from the 2D vectors, e.g., using Equation (9). This determined 922 center of gravity can be shared by both the corner removal process and the cave-in removal process, rather than calculating separate centers of gravity for corner removal and cave-in removal. In some implementations, all the 2D vectors are found 920 and a shared center of gravity is calculated 922 for each of the current starting elements in the current layer before any ranges of angle calculations are made, which can make the overall process more computationally efficient. But other approaches for when to do the finding 920 and the calculating 922 are also possible.

In any case, to calculate a range of angle for a current starting element, a first of the 2D vectors (to another starting element in the layer above the current layer for the current starting element being checked) having a greatest angle with respect to a direction opposite a direction of the center of gravity vector is found 924, a second of the 2D vectors (to another starting element in the layer above the current layer for the current starting element being checked) having a smallest angle with respect to the direction opposite the direction of the center of gravity vector is found 926, and the second of the 2D vectors is subtracted 928 from the first of the 2D vectors to produce the maximum angular difference for the current stating element. Further, as discussed above in connection with FIGS. 9A, 9C and 9D, this range of angle calculation 924, 926, 928 can be done for each starting element in the current layer (e.g., both corner and cave-in identification and removal for elements with milling depths in the current layer) beginning with the bottom most layer along the milling direction. In addition, more than one milling direction can be handled, and the finding 920 and the calculating 922 are done for each of the different milling directions.

The process of FIGS. 9A, 9C and 9D can be combined with the topology optimization process itself, e.g., the determining 900 can be performed during the process that generates a 2.5-axis compatible design, which can include generative design with layer boundary determination. Further, in some implementations, the generative design process begins with topology optimization that assumes 3-axis milling capability and then performs topology optimization with a 2.5-axis condition, and the tool-size condition operations can be employed as a part of (or in conjunction with) the 2.5-axis condition operations. Thus, when the tool-size condition is imposed, the design already satisfies the 2.5-axis condition, and the tool-size condition will modify milling depths for those elements that cannot be machined because the elements cannot be reached by the tool.

Figure 5:
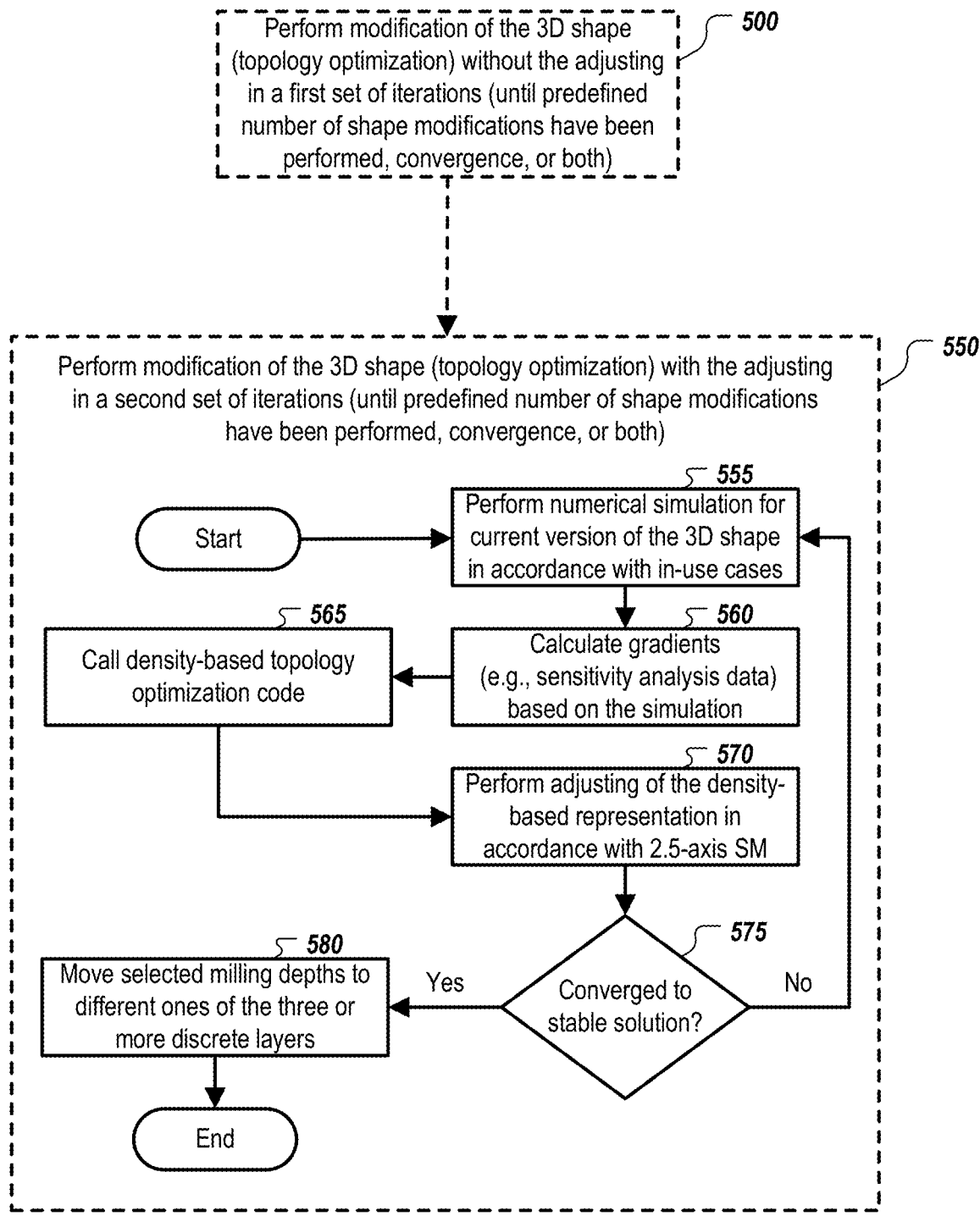
FIG. 5 shows an example of a process of generative design with layer boundary determination to produce a 3D model compatible with a 2.5-axis subtractive manufacturing process.

FIG. 5 shows an example of a process of generative design with layer boundary determination to produce a 3D model compatible with a 2.5-axis subtractive manufacturing process. The shape and topology optimization loop includes performing numerical simulation 555 of the modeled object in accordance with a current version of the 3D shape and the one or more in-use cases to produce a current numerical assessment of a physical response (e.g., structural response) of the modeled object. The current numerical assessment can be voxel-based stress field data, strain field data, or both. But as noted above, various types of numerical simulation can be performed, which can but need not include FEA simulation that computes strain energy everywhere inside the volume of the current version of the 3D shape. In any case, physics simulation of the current 3D shape produces a current numerical assessment that can then be used to change the 3D shape in view of the design criteria.

After the numerical simulation 555, gradients (e.g., sensitivity analysis data) are calculated 560 based on the current numerical assessment of the physical response of the modeled object from the simulation 555, and in accordance with the milling direction of the 2.5-axis subtractive manufacturing process. Note that the optimization engine needs gradients to know which way to change the shape to improve the design. With respect to the example given above, note that an adjoint sensitivity method calculates the gradients of objective(s) and constraints with respect to the production density, while optimization uses the sensitivity with respect to the blue print density. Therefore, the sensitivity with respect to the production density needs to be converted into the sensitivity with respect to the blue print density by using the chain rule of differentiation.

Using the chain rule of differentiation, the sensitivity with respect to the production density, $\partial g/\partial \rho_{e,N}$, can be used to calculate the sensitivity with respect to the blue print, $\partial g/\partial \rho_e$, from:

$$\frac{\partial g}{\partial \rho_e} = \sum_{k=1}^{NT} \sum_{i=e}^{N_k} \frac{\partial g}{\partial \rho_{i,N}} \frac{\partial \rho_{i,N}}{\partial (\hat{\tilde{\rho}}_i)_k} \frac{\partial (\hat{\tilde{\rho}}_i)_k}{\partial (\tilde{\rho}_i)_k} \quad (10)$$

where $N_k$ is the number of elements in the milling direction k. Note that $\partial (\tilde{\rho}_i)_k/\partial \rho_e = 1$ if i>=e and 0 otherwise. The other two terms in Equation (10) can be defined as:

$$\frac{\partial \rho_{i,N}}{\partial (\hat{\tilde{\rho}}_i)_k} = \frac{\rho_{i,N}}{(\hat{\tilde{\rho}}_i)_k}, k = 1, \ldots, NT \quad (11)$$

$$\frac{\partial (\hat{\tilde{\rho}}_i)_k}{\partial (\tilde{\rho}_i)_k} = \left(\frac{\beta \mathrm{sech}^2(\beta(\tilde{\rho}_i - \eta))}{\tanh(\beta\eta) + \tanh(\beta(1-\eta))}\right)_k \quad (12)$$

In general, calculating 560 tracks the process used for the adjusting 570 in that the projection of the elements onto the defined planes (e.g., averages used to define the planes for 2.5-axis milling from the variable contour for 3-axis milling) is taken into account when determining how much the density of an element is affected by a change during the topology optimization. Note that a change to the density of even one element on the variable contour has an affect on all the elements that are grouped into the same plane. In the case of using the average to define the milling depth, every element density contributes 1/n if there are n elements in the level. If the height of the layer is calculated as the average of grouped milling depths, this equation is differentiated to come up with a single element contribution.

Once the gradients are calculated, density-based topology optimization code is called 565. The input to the density-based topology optimizer can include the current numerical assessment of the physical response from the simulation 555 and the sensitivity analysis data that was calculated 560. The density-based topology optimizer can process these inputs using density-based optimization (e.g., SIMP) to improve the density-based representation of the generatively designed three dimensional shape with respect to the one or more design criteria by changing the densities to move the geometry towards a more optimal shape (including possible topology changes).

The adjusting of the density-based representation in accordance with the milling direction of the 2.5-axis subtractive manufacturing process, as described above, is performed 570 to help ensure that the final output is compatible with 2.5-axis machining, and a check for convergence can be performed 575, i.e., the iterative process continues until the generatively designed three dimensional shape of the modeled object in the design space converges to a stable solution in which the generatively designed three dimensional shape of the modeled object in the design space satisfies the one or more design criteria and the one or more in-use cases.

In some implementations, the numerical simulation 555, calculating 560 the gradients, topology optimization 565, and adjusting 570 iterates 575 until a predefined number of shape modifications have been performed, until convergence, or both. In any case, once the generative design converges to a stable solution that is compatible with 2.5-axis machining, selected milling depths in the generative design can be moved 580 to different ones of the three or more discrete layers (which have been defined for the 2.5-axis compatible 3D model of the generative design) using the systems and techniques described above, e.g., using one or more of the processes described in connection with FIGS. 7A-9E. In some implementations, the moving 580 is only performed once, after the topology optimization has converged 575. In some implementations, the moving 580 is included in the topology optimization loop, between the adjusting 570 and the check for convergence 575. This can be useful when intermediate results are shown to the user during the topology optimization process and it is desired to have the user see the fully manufacturable intermediate results.

Further, as noted above, in some implementations, the adjusting occurs throughout the iterative modification of the 3D shape. Thus, the operations 555-575 can be the entirety of the topology optimization loop in some implementations. However, in other implementations, the operations 555-575 represent only a portion of the iterative modification of the 3D shape. For example, the operations 555-575 can be two or more iterations performed in a topology optimization loop that is separate from one or more earlier topology optimization loops of an iterative shape modification process.

In some implementations, a first set of iterations are performed 500 without the adjusting of densities, and then a second set of iterations are performed 550 with the adjusting of densities. For example, first topology optimization can be performed 500 assuming 3-axis milling until a predefined number of shape modifications have been performed, until convergence, or both; then, second topology optimization can be performed 550 in accordance with 2.5-axis milling (as described herein) until a predefined number of shape modifications have been performed, until convergence, or both.

The topology optimization based on 3-axis milling has a variable contour of milling depths, while 2.5-axis milling has discrete milling depths. By doing the 3-axis topology optimization first (e.g., until convergence) the extra processing steps of the 2.5-axis topology optimization are avoided early on in the process, which can produce significant savings of processing resources since the initial stages of topology optimization typically involve substantial changes in the shape, at which point forcing discrete milling depths may have little benefit. Note that when 3-axis topology optimization is done first, convergence can be reached for 2.5-axis topology optimization in just two to five additional iterations, e.g., three additional iterations, and the tool-size condition can be imposed during these additional iterations or just once at the end of the topology optimization process. Moreover, using 2.5-axis topology optimization from the very beginning can cause abrupt changes in the design during the initial iterations, and so using the two stage process of FIG. 5 helps to stabilize the optimization convergence, making the process more efficient. Nonetheless, when the user has requested 2.5-axis topology optimization, it may look odd to display 3-axis intermediate results. Thus, in some implementations, the 2.5-axis projection can be performed at every iteration during topology optimization for the purpose of displaying 2.5-axis results to the user. And as noted above, the moving 580 of selected milling depths for the tool-size condition can also be performed at every iteration during topology optimization for the purpose of displaying results to the user.

In addition, in some implementations, the initial 3-axis milling topology optimization 500 need not employ the systems and techniques described in this application, but rather can employ other 3-axis milling constraints in topology optimization generally. Nonetheless, the 2.5-axis topology optimization 550, with its 2.5-axis layer definition, can be used on the output from such other processes, provided a contour of the surface for 3-axis milling is received. In such a case, the contour of the surface can be used as the milling depths, and the same procedure in 550 can be employed to find an optimum design that satisfies 2.5-axis milling conditions. Further, other 2.5-axis topology optimization systems and techniques can be used to produce a 2.5-axis compatible 3D model of the generative design, and selected milling depths in this generative design can be moved 580 to different discrete layers defined for the 2.5-axis compatible 3D model using the systems and techniques described in this document, e.g., making local fixes to the 3D model to facilitate 2.5-axis machining of a workpiece with tools of different sizes (along one or more milling directions) by determining 900 starting elements (for different subsets of elements in the density-based representation of the modeled object) and milling depths for the discrete layers of the 2.5-axis compatible 3D model, and then removing 930, 960 non-manufacturable corners and cave-ins (i.e., narrow channels).

Figure 6:
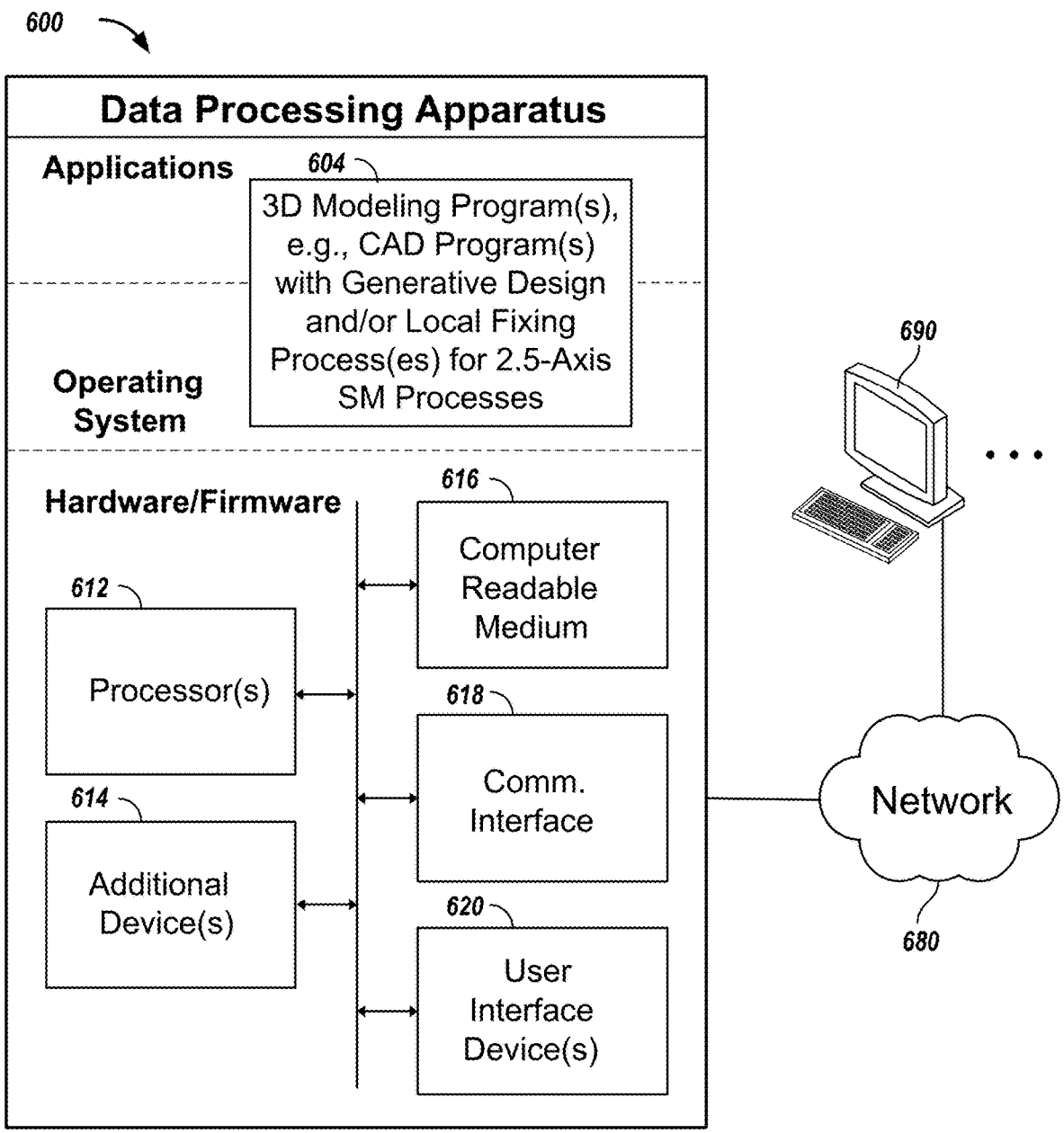
FIG. 6 is a schematic diagram of a data processing system including a data processing apparatus, which can be programmed as a client or as a server to implement the embodiments described in this specification.

FIG. 6 is a schematic diagram of a data processing system including a data processing apparatus 600, which can be programmed as a client or as a server to implement the embodiments described in this specification. The data processing apparatus 600 is connected with one or more computers 690 through a network 680. While only one computer is shown in FIG. 6 as the data processing apparatus 600, multiple computers can be used. The data processing apparatus 600 includes various software modules, which can be distributed between an applications layer and an operating system. These can include executable and/or interpretable software programs or libraries, including tools and services of one or more 3D modeling programs 604 that implement the systems and techniques described above. Thus, the 3D modeling program(s) 604 can be CAD program(s) 604 (such as CAD program(s) 116) and can implement (1) one or more generative design processes (e.g., using SIMP based method(s) for generative design) for topology optimization and physical simulation operations (finite element analysis (FEA) or other) that incorporate layer boundary determination for producing a 2.5-axis machinable output and/or (2) one or more local fixing processes for removal of non-manufacturable corners and cave-ins (i.e., narrow channels), with or without multiple milling directions. Further, the program(s) 604 can potentially implement manufacturing control operations (e.g., generating and/or applying toolpath specifications to effect manufacturing of designed objects). The number of software modules used can vary from one implementation to another. Moreover, the software modules can be distributed on one or more data processing apparatus connected by one or more computer networks or other suitable communication networks.

The data processing apparatus 600 also includes hardware or firmware devices including one or more processors 612, one or more additional devices 614, a computer readable medium 616, a communication interface 618, and one or more user interface devices 620. Each processor 612 is capable of processing instructions for execution within the data processing apparatus 600. In some implementations, the processor 612 is a single or multi-threaded processor. Each processor 612 is capable of processing instructions stored on the computer readable medium 616 or on a storage device such as one of the additional devices 614. The data processing apparatus 600 uses the communication interface 618 to communicate with one or more computers 690, for example, over the network 680. Examples of user interface devices 620 include a display, a camera, a speaker, a microphone, a tactile feedback device, a keyboard, a mouse, and VR and/or AR equipment. The data processing apparatus 600 can store instructions that implement operations associated with the program(s) described above, for example, on the computer readable medium 616 or one or more additional devices 614, for example, one or more of a hard disk device, an optical disk device, a tape device, and a solid state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, e.g., after delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., an LCD (liquid crystal display) display device, an OLED (organic light emitting diode) display device, or another monitor, for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a browser user interface through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, actions recited in the claims can be performed in a different order and still achieve desirable results.

What is claimed is:

1. A method comprising:

obtaining (i) a density-based representation of a modeled object for which a corresponding physical structure is to be manufactured using a 2.5-axis subtractive manufacturing process with one or more computer-controlled manufacturing systems, and (ii) data specifying a starting element for each of multiple different subsets of elements in the density-based representation of the modeled object,
- wherein each of the element subsets has a milling depth, which is one of three or more shared milling depths assigned respectively for three or more discrete layers, each of the three or more discrete layers being perpendicular to a milling direction of the 2.5-axis subtractive manufacturing process, and
- wherein the density-based representation specifies a three dimensional shape of the modeled object, which has been generatively designed using density-based topology optimization;

processing starting elements of the element subsets having milling depths associated with discrete layers below a top most layer of the three or more discrete layers, with respect to the milling direction, the processing comprising, for a current starting element of the starting elements being processed for a current layer,
- identifying other starting elements that (i) have element subsets having milling depths associated with a layer above the current layer and (ii) are closer to the current starting element than an amount that is at least equal to a radius of a smallest milling tool available for use with the one or more computer-controlled manufacturing systems,
- calculating a maximum angular difference between the other starting elements with respect to the current starting element, and
- moving the milling depth for the element subset of the current starting element to a layer above the current layer by at least changing density values for at least a portion of individual elements in the element subset, in response to the maximum angular difference being greater than a threshold value, to remove a non-manufacturable corner in the modeled object; and providing the three dimensional shape of the modeled object for use in manufacturing the physical structure using the one or more computer-controlled manufacturing systems that employ the 2.5-axis subtractive manufacturing process.

2. The method of claim 1, wherein the identifying comprises:

selecting a starting element to check, wherein the element subset for this selected starting element has a milling depth associated with the layer above the current layer;
comparing a centroid of the selected starting element with a centroid of the current starting element;
confirming the selected starting element as an identified one of the other starting elements in response to a distance between the centroid of the selected starting element and the centroid of the current starting element being less than the amount, wherein the amount is set equal to the maximum of (i) the radius of the smallest milling tool available and (ii) a predefined fraction of a difference between a bottom of the current layer and the top most layer; and
repeating the selecting, the comparing, and the confirming until each of the starting elements having a milling depth associated with the layer above the current layer have been checked.

3. The method of claim 1, wherein the calculating comprises:

finding two dimensional vectors between the current starting element in the current layer and each of the other starting elements with milling depths associated with one or more layers above the current layer;
determining a center of gravity vector from the two dimensional vectors;
finding a first of the two dimensional vectors having a greatest angle with respect to a direction opposite a direction of the center of gravity vector;
finding a second of the two dimensional vectors having a smallest angle with respect to the direction opposite the direction of the center of gravity vector; and
subtracting the second of the two dimensional vectors from the first of the two dimensional vectors to produce the maximum angular difference.

4. The method of claim 3, wherein finding the two dimensional vectors comprises finding two dimensional vectors between the current starting element in the current layer and each one of all starting elements with milling depths associated with any layer above the current layer.

5. The method of claim 3, wherein the identifying, the calculating and the moving are part of a corner removal process, and the processing further comprises a cave-in removal process comprising, for an additional current starting element of the starting elements being processed for an additional current layer:

second identifying additional starting elements that (i) have additional element subsets having milling depths associated with a layer above the additional current layer and (ii) are adjacent to the additional current starting element;
second calculating a second maximum angular difference between the additional starting elements with respect to the additional current starting element; and
second moving the milling depth for the additional element subset of the additional current starting element to a layer above the additional current layer by at least changing density values for at least a portion of additional individual elements in the additional element subset, in response to the second maximum angular difference being greater than or equal to a second threshold value, to remove a non-manufacturable cave-in in the modeled object.

6. The method of claim 5, wherein the threshold value for the maximum angular difference between the other starting elements with respect to the current starting element is one hundred and ninety five degrees, wherein the second maximum angular difference is one hundred and eighty degrees, wherein the corner removal process is performed sequentially for layers above the current layer beginning with a layer immediately above the current layer, and wherein the cave-in removal process is performed sequentially for layers above the current layer beginning with the top most layer.

7. The method of claim 5, wherein the processing comprises repeating the corner removal process and the cave-in removal process until no further moving of milling depths for the element subsets is performed.

8. The method of claim 5, wherein the milling direction is a first of two or more milling directions of the 2.5-axis subtractive manufacturing process, the corner removal process and the cave-in removal process are performed separately for each of the two or more milling directions to produce respective milling-direction-specific data sets, and the processing comprises combining the respective milling-direction-specific data sets to update the density-based representation of the modeled object, which has been generatively designed using density-based topology optimization.

9. The method of claim 1, wherein the density-based representation of the modeled object comprises a non-regular mesh, and obtaining the data specifying a starting element for each of multiple different subsets of elements in the density-based representation of the modeled object comprises:
sorting the elements in the density-based representation according to positions of centroids of the elements along an axis of the milling direction to form a sorted list of the elements;
selecting a next unassigned element in the sorted list to be a next starting element;
finding a next set of the elements in the density-based representation having their centroids within a predefined distance from the centroid of the next starting element;
assigning the next set of elements to the next starting element to form one of the multiple different subsets of elements in the density-based representation of the modeled object; and
repeating the selecting, the finding, and the assigning until no elements in the sorted list remain unassigned.

10. The method of claim 9, wherein obtaining the density-based representation of the modeled object comprises iteratively modifying the three dimensional shape of the modeled object in a design space using the density-based topology optimization, one or more design criteria and one or more in-use cases, wherein the iteratively modifying comprises adjusting the density-based representation of the generatively designed three dimensional shape in accordance with the milling direction of the 2.5-axis subtractive manufacturing process in at least two iterations of the iteratively modifying, the adjusting comprises the obtaining the data specifying a starting element for each of multiple different subsets of elements in the density-based representation of the modeled object.

11. The method of claim 1, wherein the providing comprises:
generating toolpath specifications for a subtractive manufacturing machine, in accordance with the 2.5-axis subtractive manufacturing process, using the three dimensional shape of the modeled object; and
manufacturing at least a portion of the physical structure, or a mold for the physical structure, with the subtractive manufacturing machine using the toolpath specifications.

12. A system comprising:
a non-transitory storage medium having instructions of a computer aided design program stored thereon; and
one or more data processing apparatus configured to run the instructions of the computer aided design program to cause the one or more data processing apparatus to
obtain (i) a density-based representation of a modeled object for which a corresponding physical structure is to be manufactured using a 2.5-axis subtractive manufacturing process with one or more computer-controlled manufacturing systems, and (ii) data specifying a starting element for each of multiple different subsets of elements in the density-based representation of the modeled object,
wherein each of the element subsets has a milling depth, which is one of three or more shared milling depths assigned respectively for three or more discrete layers, each of the three or more discrete layers being perpendicular to a milling direction of the 2.5-axis subtractive manufacturing process, and
wherein the density-based representation specifies a three dimensional shape of the modeled object, which has been generatively designed using density-based topology optimization;
process starting elements of the element subsets having milling depths associated with discrete layers below a top most layer of the three or more discrete layers, with respect to the milling direction, wherein the instructions cause the one or more data processing apparatus to process the starting elements of the element subsets by causing the one or more data processing apparatus to, for a current starting element of the starting elements being processed for a current layer,
identify other starting elements that (i) have element subsets having milling depths associated with a layer above the current layer and (ii) are closer to the current starting element than an amount that is at least equal to a radius of a smallest milling tool available for use with the one or more computer-controlled manufacturing systems,
calculate a maximum angular difference between the other starting elements with respect to the current starting element, and
move the milling depth for the element subset of the current starting element to a layer above the current layer by at least changing density values for at least a portion of individual elements in the element subset, in response to the maximum angular difference being greater than a threshold value, to remove a non-manufacturable corner in the modeled object; and
provide the three dimensional shape of the modeled object for use in manufacturing the physical structure using the one or more computer-controlled manufacturing systems that employ the 2.5-axis subtractive manufacturing process.

13. The system of claim 12, wherein the instructions cause the one or more data processing apparatus to identify the other starting elements by causing the one or more data processing apparatus to:
select a starting element to check, wherein the element subset for this selected starting element has a milling depth associated with the layer above the current layer;
compare a centroid of the selected starting element with a centroid of the current starting element;
confirm the selected starting element as an identified one of the other starting elements in response to a distance between the centroid of the selected starting element and the centroid of the current starting element being less than the amount, wherein the amount is set equal to the maximum of (i) the radius of the smallest milling tool available and (ii) a predefined fraction of a difference between a bottom of the current layer and the top most layer; and
repeat the selecting, the comparing, and the confirming until each of the starting elements having a milling depth associated with the layer above the current layer have been checked.

14. The system of claim 12, wherein the instructions cause the one or more data processing apparatus to calculate the maximum angular difference by causing the one or more data processing apparatus to:
  find two dimensional vectors between the current starting element in the current layer and each of the other starting elements with milling depths associated with one or more layers above the current layer;
  determine a center of gravity vector from the two dimensional vectors;
  find a first of the two dimensional vectors having a greatest angle with respect to a direction opposite a direction of the center of gravity vector;
  find a second of the two dimensional vectors having a smallest angle with respect to the direction opposite the direction of the center of gravity vector; and
  subtract the second of the two dimensional vectors from the first of the two dimensional vectors to produce the maximum angular difference.

15. The system of claim 14, wherein the instructions cause the one or more data processing apparatus to find the two dimensional vectors by causing the one or more data processing apparatus to find two dimensional vectors between the current starting element in the current layer and each one of all starting elements with milling depths associated with any layer above the current layer.

16. The system of claim 14, wherein the instructions cause the one or more data processing apparatus to identify the other starting elements, calculate the maximum angular difference and move the milling depth for the element subset as part of a corner removal process, the instructions cause the one or more data processing apparatus to process the starting elements of the element subsets in a cave-in removal process by causing the one or more data processing apparatus to, for an additional current starting element of the starting elements being processed for an additional current layer:
  identify additional starting elements that (i) have additional element subsets having milling depths associated with a layer above the additional current layer and (ii) are adjacent to the additional current starting element;
  calculate a second maximum angular difference between the additional starting elements with respect to the additional current starting element; and
  move the milling depth for the additional element subset of the additional current starting element to a layer above the additional current layer by at least changing density values for at least a portion of additional individual elements in the additional element subset, in response to the second maximum angular difference being greater than or equal to a second threshold value, to remove a non-manufacturable cave-in in the modeled object.

17. The system of claim 16, wherein the threshold value for the maximum angular difference between the other starting elements with respect to the current starting element is one hundred and ninety five degrees, wherein the second maximum angular difference is one hundred and eighty degrees, wherein the corner removal process is performed sequentially for layers above the current layer beginning with a layer immediately above the current layer, and wherein the cave-in removal process is performed sequentially for layers above the current layer beginning with the top most layer.

18. The system of claim 16, wherein the instructions cause the one or more data processing apparatus to process the starting elements of the element subsets by causing the one or more data processing apparatus to repeat the corner removal process and the cave-in removal process until no further milling depths for the element subsets are moved.

19. The system of claim 16, wherein the milling direction is a first of two or more milling directions of the 2.5-axis subtractive manufacturing process, the corner removal process and the cave-in removal process are performed separately for each of the two or more milling directions to produce respective milling-direction-specific data sets, and the instructions cause the one or more data processing apparatus to process the starting elements of the element subsets by causing the one or more data processing apparatus to combine the respective milling-direction-specific data sets to update the density-based representation of the modeled object, which has been generatively designed using density-based topology optimization.

20. The system of claim 12, wherein the density-based representation of the modeled object comprises a non-regular mesh, and the instructions cause the one or more data processing apparatus to obtain the data by causing the one or more data processing apparatus to:
  sort the elements in the density-based representation according to positions of centroids of the elements along an axis of the milling direction to form a sorted list of the elements;
  select a next unassigned element in the sorted list to be a next starting element;
  find a next set of the elements in the density-based representation having their centroids within a predefined distance from the centroid of the next starting element;
  assign the next set of elements to the next starting element to form one of the multiple different subsets of elements in the density-based representation of the modeled object; and
  repeat the next unassigned element selection, the next set finding, and the assignment until no elements in the sorted list remain unassigned.

21. The system of claim 20, wherein the instructions cause the one or more data processing apparatus to obtain the density-based representation of the modeled object by causing the one or more data processing apparatus to iteratively modify the three dimensional shape of the modeled object in a design space using the density-based topology optimization, one or more design criteria and one or more in-use cases, the instructions cause the one or more data processing apparatus to iteratively modify the three dimensional shape of the modeled object by causing the one or more data processing apparatus to adjust the density-based representation of the generatively designed three dimensional shape in accordance with the milling direction of the 2.5-axis subtractive manufacturing process in at least two iterations of the iteratively modification, and the instructions cause the one or more data processing apparatus to adjust the density-based representation by causing the one or more data processing apparatus to obtain the data specifying a starting element for each of multiple different subsets of elements in the density-based representation of the modeled object.

22. The system of claim 12, comprising the one or more computer-controlled manufacturing systems comprising a computer numerically controlled subtractive manufacturing milling machine that employs the 2.5-axis subtractive manufacturing process, wherein the one or more processing apparatus are configured to run the instructions of the computer aided design program to cause the one or more data processing apparatus to:

generate toolpath specifications for the computer numerically controlled subtractive manufacturing milling machine, in accordance with the 2.5-axis subtractive manufacturing process, using the three dimensional shape of the modeled object; and manufacture at least a portion of the physical structure, or a mold for the physical structure, with the computer numerically controlled subtractive manufacturing milling machine using the toolpath specifications.

23. A non-transitory computer-readable medium encoding a program operable to cause one or more data processing apparatus to perform operations comprising:

obtaining (i) a density-based representation of a modeled object for which a corresponding physical structure is to be manufactured using a 2.5-axis subtractive manufacturing process with one or more computer-controlled manufacturing systems, and (ii) data specifying a starting element for each of multiple different subsets of elements in the density-based representation of the modeled object,
wherein each of the element subsets has a milling depth, which is one of three or more shared milling depths assigned respectively for three or more discrete layers, each of the three or more discrete layers being perpendicular to a milling direction of the 2.5-axis subtractive manufacturing process, and
wherein the density-based representation specifies a three dimensional shape of the modeled object, which has been generatively designed using density-based topology optimization;

processing starting elements of the element subsets having milling depths associated with discrete layers below a top most layer of the three or more discrete layers, with respect to the milling direction, the processing comprising, for a current starting element of the starting elements being processed for a current layer,
identifying other starting elements that (i) have element subsets having milling depths associated with a layer above the current layer and (ii) are closer to the current starting element than an amount that is at least equal to a radius of a smallest milling tool available for use with the one or more computer-controlled manufacturing systems,
calculating a maximum angular difference between the other starting elements with respect to the current starting element, and
moving the milling depth for the element subset of the current starting element to a layer above the current layer by at least changing density values for at least a portion of individual elements in the element subset, in response to the maximum angular difference being greater than a threshold value, to remove a non-manufacturable corner in the modeled object; and providing the three dimensional shape of the modeled object for use in manufacturing the physical structure using the one or more computer-controlled manufacturing systems that employ the 2.5-axis subtractive manufacturing process.

24. The non-transitory computer-readable medium of claim 23, wherein the identifying, the calculating and the moving are part of a corner removal process, and the processing further comprises a cave-in removal process comprising, for an additional current starting element of the starting elements being processed for an additional current layer:

second identifying additional starting elements that (i) have additional element subsets having milling depths associated with a layer above the additional current layer and (ii) are adjacent to the additional current starting element;
second calculating a second maximum angular difference between the additional starting elements with respect to the additional current starting element; and
second moving the milling depth for the additional element subset of the additional current starting element to a layer above the additional current layer by at least changing density values for at least a portion of additional individual elements in the additional element subset, in response to the second maximum angular difference being greater than or equal to a second threshold value, to remove a non-manufacturable cave-in in the modeled object.

* * * * *